US012613270B2

(12) United States Patent
Yao et al.

(10) Patent No.: US 12,613,270 B2
(45) Date of Patent: Apr. 28, 2026

(54) WAFER ACCEPTANCE TEST TOOL AND TEST METHOD USING THEREOF

(71) Applicants: TAIWAN SEMICONDUCTOR MANUFACTURING COMPANY, LTD., Hsinchu (TW); TSMC CHINA COMPANY LIMITED, Shanghai (CN)

(72) Inventors: Jin Yao, Shanghai (CN); SenSen Zhang, Shanghai (CN); Ni Shen, Shanghai (CN); WanGeng Li, Shanghai (CN); Chang-Chun Xu, Shanghai (CN)

(73) Assignees: TAIWAN SEMICONDUCTOR MANUFACTURING COMPANY, LTD., Hsinchu (TW); TSMC CHINA COMPANY LIMITED, Shanghai (CN)

( * ) Notice: Subject to any disclaimer, the term of this patent is extended or adjusted under 35 U.S.C. 154(b) by 160 days.

(21) Appl. No.: 18/516,518

(22) Filed: Nov. 21, 2023

(65) Prior Publication Data

US 2025/0155491 A1 May 15, 2025

(30) Foreign Application Priority Data

Nov. 9, 2023 (CN) .......................... 202323030397.2

(51) Int. Cl.
*G01R 31/28* (2006.01)
*G01R 1/02* (2006.01)
(Continued)

(52) U.S. Cl.
CPC ..... *G01R 31/2856* (2013.01); *G01R 1/07342* (2013.01); *G01R 31/2889* (2013.01); *H01L 22/14* (2013.01)

(58) Field of Classification Search
CPC ...... G01R 31/28; G01R 31/31; G01R 31/311; G01R 31/319; G01R 35/00; G01R 1/02;
(Continued)

(56) References Cited

U.S. PATENT DOCUMENTS

2008/0218189 A1* 9/2008 Lin .................... G01R 31/2891
324/754.01
2010/0305897 A1* 12/2010 Strom ................ G01R 31/2891
702/85
(Continued)

FOREIGN PATENT DOCUMENTS

TW 201734486 A 10/2017

*Primary Examiner* — Neel D Shah
(74) *Attorney, Agent, or Firm* — Maschoff Brennan

(57) ABSTRACT

A method includes pressing probes against probe pads on a test line over a substrate at a first position on the probe pads to form first probe marks on the probe pads; capturing first images of the first probe marks on the probe pads; transmitting the captured first images of the first probe marks to an image inspection machine; identifying the first probe marks from the probe pads of the captured first images through the image inspection machine; determining whether the identified first probe marks are acceptable through the image inspection machine; in response to the determination determines that the identified first probe marks are acceptable, performing a first wafer acceptance test (WAT) to the substrate with the probes at the first position.

20 Claims, 28 Drawing Sheets

(51) Int. Cl.

| | |
|---|---|
| *G01R 1/04* | (2006.01) |
| *G01R 1/067* | (2006.01) |
| *G01R 1/073* | (2006.01) |
| *G01R 35/00* | (2006.01) |
| *H01L 21/66* | (2006.01) |

(58) Field of Classification Search
CPC .......... G01R 1/04; G01R 1/067; G01R 1/073;
H01L 21/66
See application file for complete search history.

(56) References Cited

U.S. PATENT DOCUMENTS

| | | | |
|---|---|---|---|
| 2019/0187180 A1* | 6/2019 | Watanabe | .......... G01R 1/06794 |
| 2021/0239736 A1* | 8/2021 | Tsai | ................. G01R 31/31935 |

* cited by examiner

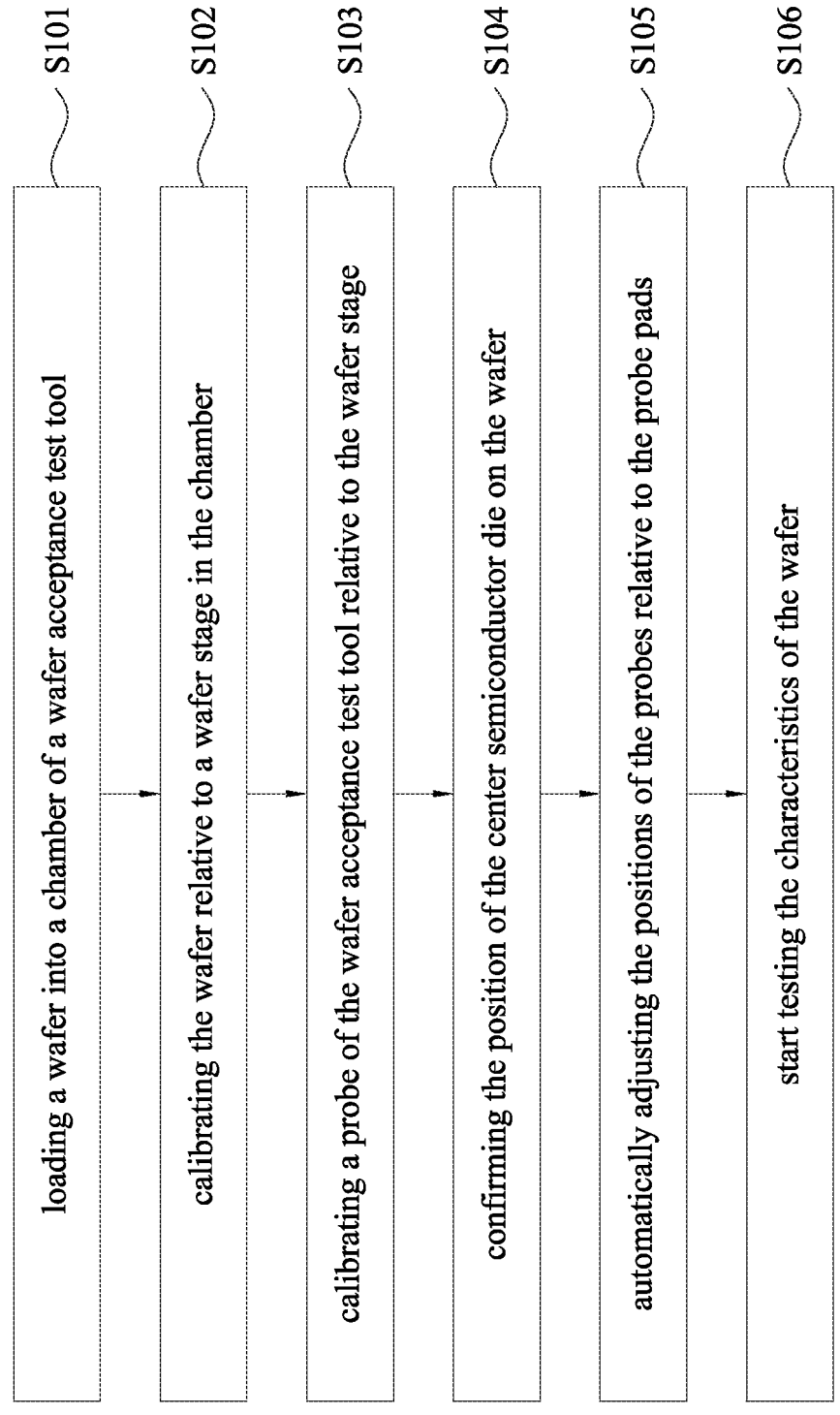

M

S101 loading a wafer into a chamber of a wafer acceptance test tool

S102 calibrating the wafer relative to a wafer stage in the chamber

S103 calibrating a probe of the wafer acceptance test tool relative to the wafer stage

S104 confirming the position of the center semiconductor die on the wafer

S105 automatically adjusting the positions of the probes relative to the probe pads

S106 start testing the characteristics of the wafer

Fig. 1A

WAFER ACCEPTANCE TEST TOOL AND TEST METHOD USING THEREOF

PRIORITY CLAIM AND CROSS-REFERENCE

The present application claims priority to China Application Serial No. 202323030397.2, filed Nov. 9, 2023, which is herein incorporated by reference.

BACKGROUND

Wafers are used as carriers for fabrication during the production of integrated circuits (ICs). After semiconductor fabrication processes, a plurality of dies are formed on a wafer, and the integrated circuit devices (or IC dies) are typically tested at the wafer level before singulation. These dies are later separated through a die cutting or singulation process in which typically a mechanical or laser saw is used to cut through the wafer between individual chips or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate a flow chart including operations for measuring characteristics of a wafer, in accordance with some embodiments of the present disclosure.

FIG. 4D-5E illustrate schematic views of probe pads having probe marks thereon after wafer acceptance tests in accordance with some embodiments of the present disclosure.

DETAILED DESCRIPTION

Figure 1B:
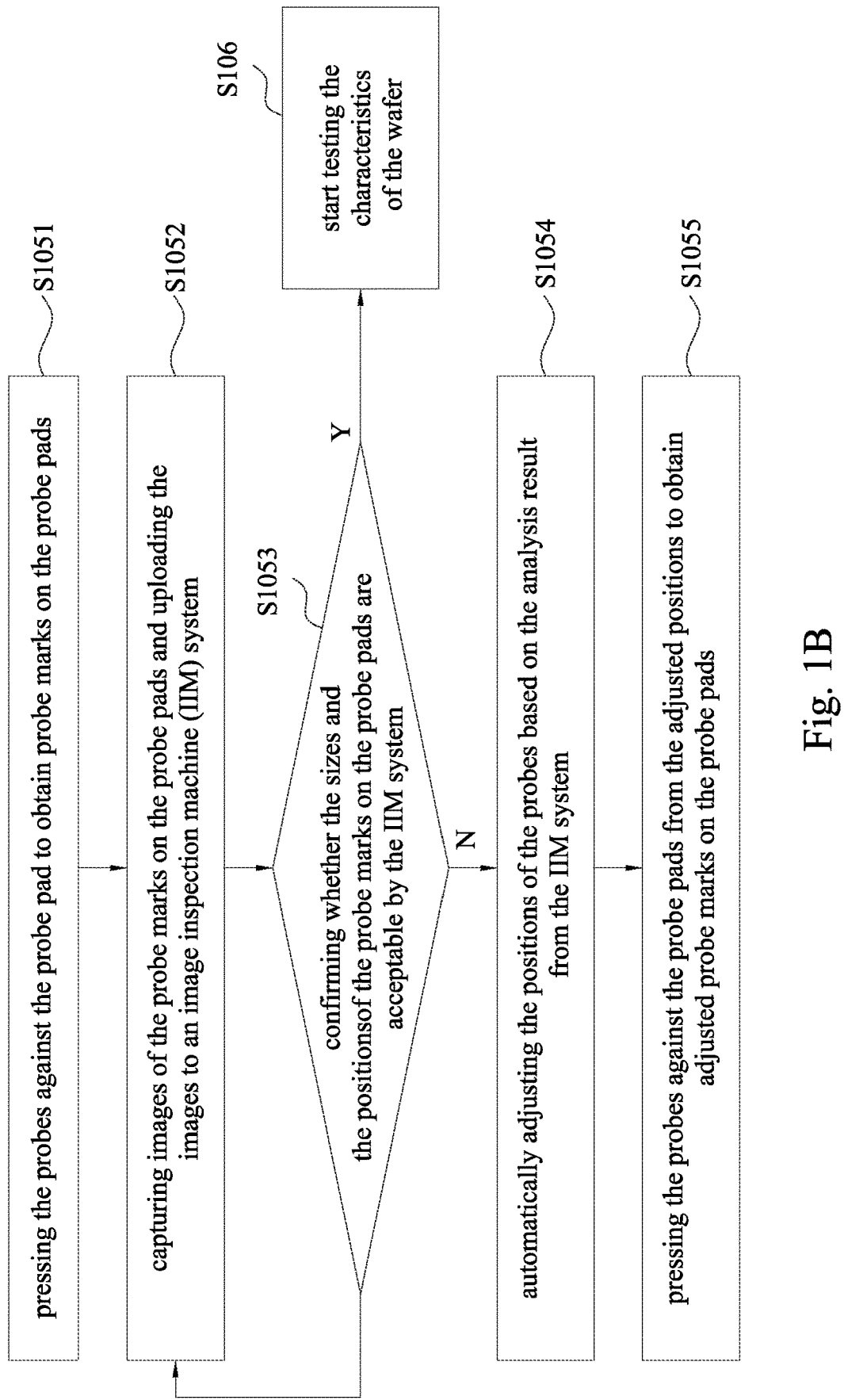

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the integrated circuits. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The wafer acceptance test (WAT) testing tool lacks the capability for automated recognition and adjustment of probe marks during the initial testing phase. As a result, operators are required to visually inspect and manually adjust the probe marks, involving a significant number of manual interactions. This manual process is time-consuming and is prone to inefficiency and potential testing issues. The reliance on manual adjustments for probe marks poses challenges in maintaining high quality and can impact overall testing capacity, utilizing the WAT capacity.

Therefore, the present disclosure in various embodiments provides a WAT tool that enables automated recognition and adjustment of probe marks. By integrating an advanced AI-powered image inspection machine (IIM), the WAT tool addresses the limitations of human visual recognition by accurately analyzing probe mark images captured by cameras. Through extensive machine learning on a diverse range of probe mark samples, the IIM achieves identification of various characteristics, such as pad texture, shading, density, and position. By utilizing the data from the IIM, the WAT tool can determine the required adjustments for probe marks, eliminating the need for manual intervention and enhancing process efficiency. This leads to a reduction in process time, improved productivity, and enhanced quality assurance. Furthermore, the tool accurately records and logs all probe mark adjustments, enabling valuable analysis and optimization of the process.

Reference is made to FIGS. 1A and 1B. FIGS. 1A and 1B illustrate an exemplary wafer acceptance test method M on a semiconductor wafer in accordance with some embodiments. The wafer acceptance test method M includes a relevant part of the entire wafer acceptance test process. The wafer acceptance test method M may be implemented, in whole or in part, by a system employing a wafer acceptance test tool 200 (see FIG. 3A) with wafer acceptance test (WAT) system 228 and an image inspection machine (IIM) system 230, and other appropriate lithography processes to improve pattern dimension accuracy. Additional operations can be provided before, during, and after the wafer acceptance test method M, and some operations described can be replaced, eliminated, modified, moved around, or relocated for additional embodiments of the method. One of ordinary skill in the art may recognize other examples of wafer acceptance test processes that may benefit from aspects of the present disclosure. The wafer acceptance test method M is an example, and is not intended to limit the present disclosure beyond what is explicitly recited in the claims. In some embodiments, the IIM system 230 can be interchangeably referred to as an image inspection machine, or an image inspection apparatus.

The wafer acceptance test method M is described below in conjunction with FIGS. 2A-7C in which a wafer W is tested by using the wafer acceptance test method M. As shown in FIG. 2A, a wafer acceptance test tool 200 can be configured to test a semiconductor die 112 formed on the wafer W. The wafer W may comprise an elementary semiconductor such as silicon, germanium, or diamond. The wafer W may include one or more dies 112 formed thereon. Scribe lines can be provided between adjacent semiconductor dies 112 so that the semiconductor dies 112 can be separated by subsequent processing. In some embodiments, the dies 112 can be integrated circuits (ICs) or chips. In some embodiments, the semiconductor dies 112 will be shipped after manufacturing of the semiconductor wafer W.

Figure 2B:
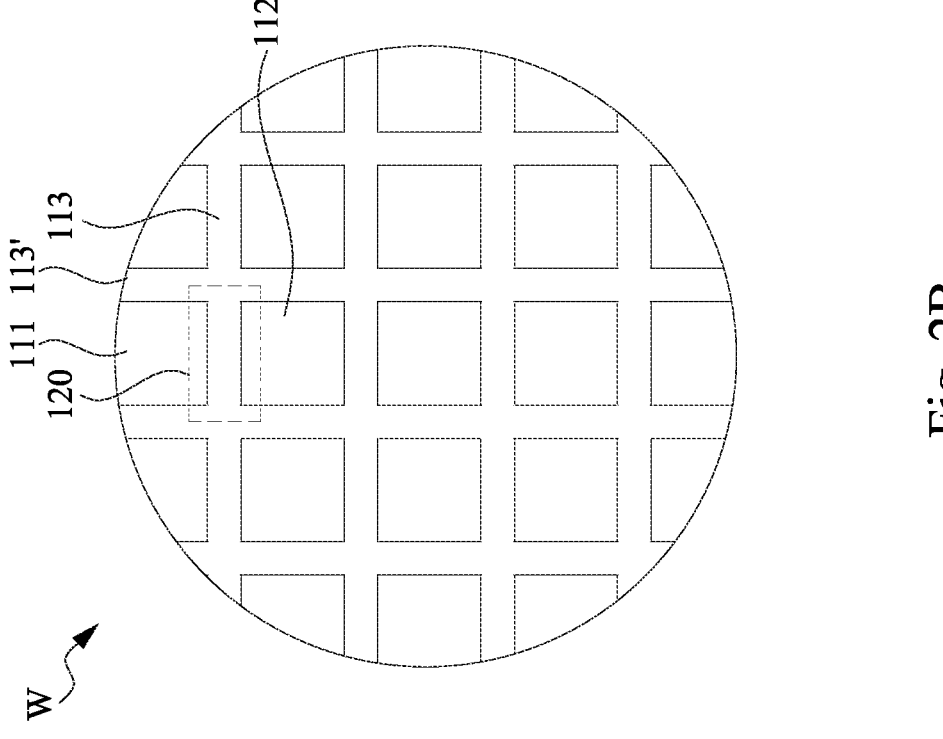
FIGS. 2A and 2B illustrate a perspective view and a top view of a semiconductor wafer, in accordance with some embodiments of the present disclosure.
Figure 2A:
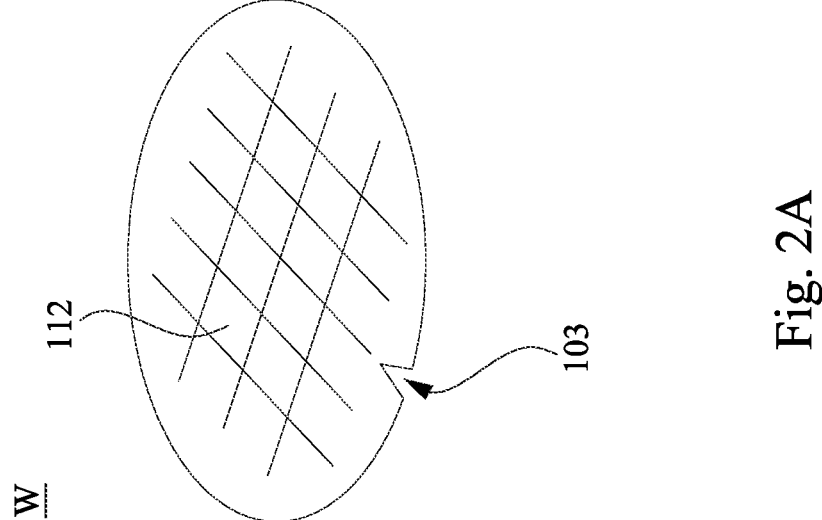

As shown in FIG. 2B, the wafer W may include a plurality of dies (such as semiconductor dies 111 and 112) arranged in a grid pattern, which includes a plurality of rows and columns of dies. Each row of the dies is separated by horizontal scribe lines 113, and each column of dies or chips are separated by vertical scribe lines 113'. Individual semiconductor dies 111 and 112 within the wafer W may contain circuitry. The semiconductor dies 111 and 112 can be separated by a sawing operation performed through the scribe lines (e.g., the horizontal scribe lines 113) and then packaged to form separated devices. In some embodiments, the test line area 120 can be removed during dicing of the wafer W. The semiconductor dies 111 and 112 on the semiconductor wafer W may include several basic circuit elements, which can be interconnected to form semiconductor structures to form logic or other functions. In some embodiments, the basic circuit elements may include active devices such as transistors and passive devices such as resistors, capacitors, inductors, or a combination thereof. In an exemplary semiconductor fabrication process, each basic circuit element may need to be tested and evaluated at selected steps, or at the end, of the formation so as to maintain and assure the device quality.

Figure 2C:
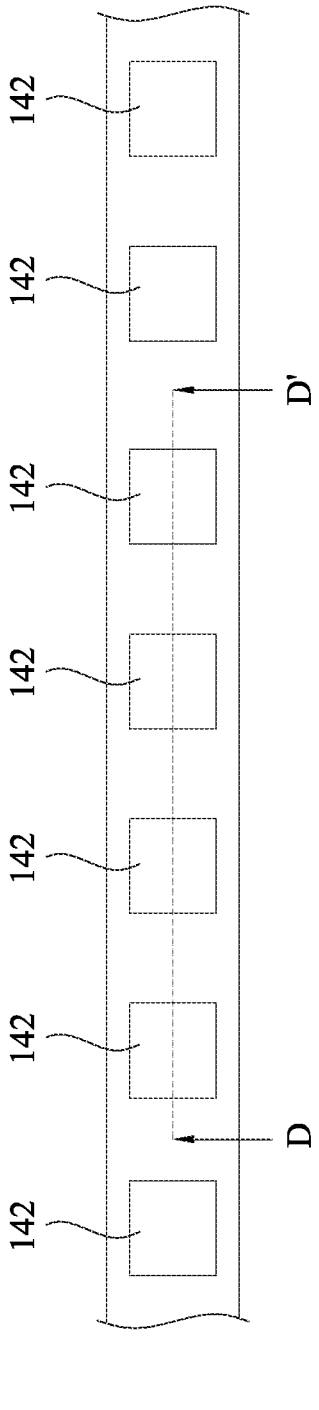
FIG. 2C illustrates a partial enlarged view of a test line on a semiconductor wafer in FIG. 2B in accordance with some embodiments of the present disclosure.

A test line area 120 is on the wafer W as shown in FIGS. 2B and 2C. The test line area 120 in FIG. 2C can be a schematic block diagram of a portion of the wafer W denoted by the dashed box as shown in FIG. 2B. In some embodiments, one or more of the test line areas 120 can be formed in the scribe lines 113 (see FIG. 2B). In some embodiments, one or more of the test line areas 120 can be formed in the scribe lines 113'. In alternative embodiments, one or more of the test lines 120 can be formed inside the semiconductor dies 111 and 112. In some embodiments, the test line area 120 can be used to monitor the quality of wafer processing in manufacturing, for example, to observe the device variation on the wafer W. The test line area 120 may include one or more probe pads 142 exposed through the top surface of the wafer W. In some embodiments, the number of the probe pads 142 depends on the design and area. For example, but not limited to, one test line area 120 may include twenty-two test probe pads.

Figure 2D:
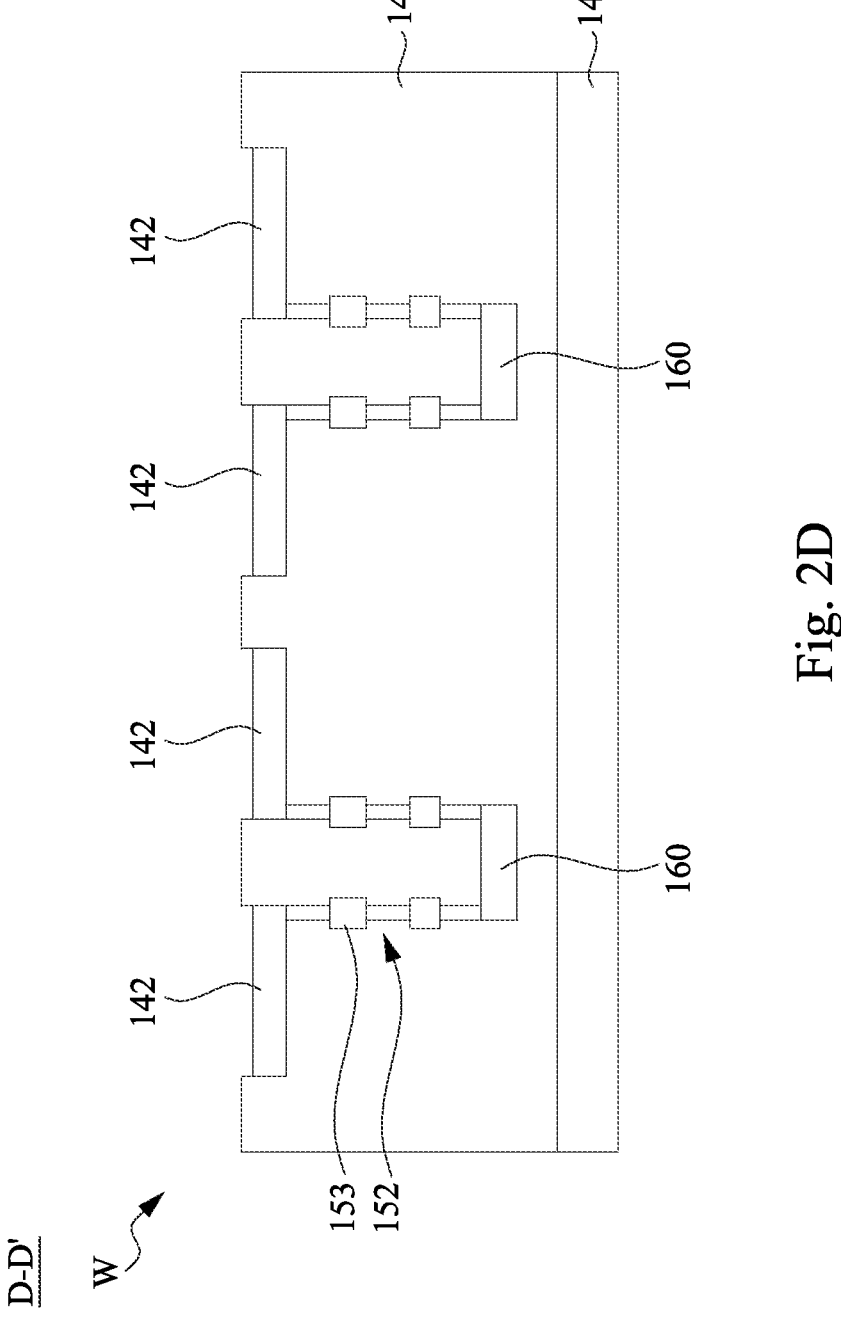
FIG. 2D illustrates a cross-sectional view of obtained from the reference cross-sections D-D' in FIG. 2C in accordance with some embodiments of the present disclosure.

As shown in FIG. 2D illustrating a cross-sectional view of a semiconductor structure obtained from the reference cross-sections D-D' in FIG. 2C. The semiconductor structure may include a semiconductive substrate 140, a dielectric stack 141 over the semiconductive substrate 140, the probe pads 142 formed on a top of the dielectric stack 141, the test device 160 embedded in the dielectric stack 141 and electrically connected to the corresponding probe pads 142, and a via string stacking 152 along a direction extending from a level of the probe pad 142 to the semiconductive substrate 140 and electrically connecting the periphery of the probe pad 142 to the test device 160. In some embodiments, the semiconductor structure can be interchangeably referred to as a test line structure.

In some embodiments, the semiconductive substrate 140 includes polysilicon, silane ($SiH_4$), di-silane ($Si_2H_6$), or di-clorsilane ($SiCl_2H_4$), silicon germanium, gallium arsenic, or other suitable semiconductor materials so as to function as a conductive material under certain conditions. In some embodiments, the semiconductive substrate 140 further includes doped regions, such as a P-well, an N-well, and/or a doped active region such as a $P^+$ doped active region. In some embodiments, the semiconductive substrate 140 may further include other features such as a buried layer and/or an epitaxy layer. Furthermore, the semiconductive substrate 140 may be a semiconductor on insulator such as silicon on insulator (SOI). In some embodiments, the semiconductive substrate 140 may include a doped epitaxy layer, a gradient semiconductor layer, and/or a semiconductor layer overlying another semiconductor layer of a different type such as a silicon layer on a silicon germanium layer. In some embodiments, the semiconductive substrate 140 may include a multilayer silicon structure or a multilayer compound semiconductor configuration. In some embodiments, the semiconductive substrate 140 includes an inter-layer dielectric (ILD) layer. In some embodiments, the ILD layer may be a silicon oxide layer or any suitable ILD layer.

The dielectric stack 141 is disposed over the semiconductive substrate 140. In some embodiments, the dielectric stack 141 is disposed over the semiconductive substrate 140 so as to isolate the test device 160. In some embodiments, the dielectric stack 141 is a low-k dielectric stack. The dielectric constant (k value) of the low-k dielectric stack may be lower than 3.0, or lower than about 2.5, and the dielectric stack may therefore also be referred to as an extreme low-k (ELK) dielectric stack. The material for the dielectric stack 141 may include organic dielectric material such as organic silicate glass (OSG), porous methyl silsesquioxane (p-MSQ), hydrogen silsesquioxane (HSQ), a combination thereof, or any other suitable organic low-k or extreme low-k material. In some embodiments, the material for the dielectric stack 141 may include inorganic dielectric material such as carbon-doped silicon oxide, fluorine-doped silicate glass (FSG), a combination thereof, or any other suitable inorganic low-k or extreme low-k material. In some other embodiments, other suitable dielectric materials, such as silicon oxide or phosphosilicate glass (PSG), may also be used. In some embodiments, the dielectric stack 141 is made from dielectric materials selected from a group comprising silicon dioxide (SiO2), silicon carbide (SiC), silicon nitride (Si3N4), and the combinations thereof. In some embodiments, the dielectric stack 141 is arranged in a rectangle as seen from a top view, but the disclosure is not limited thereto. In some embodiments, the dielectric stack 141 includes a plurality of sublayers (not shown). In some embodiments, the dielectric material included in different sublayers may be the same or different.

The probe pads 142 are formed on a top of the dielectric stack 141. In some embodiments, the probe pads 142 of the semiconductor structure are configured to electrically connect to an external circuit or probes of a probe card to check the quality of the integrated circuit, as part of the wafer acceptance test. In some embodiments, the probe pads 142 of the semiconductor structure are configured to apply test stimuli to a corresponding test device 160. In some embodiments, the probe pad 142 can have a square shape from a top view (see FIG. 2C). The probe pad 142 can be, but are not limited to, round, oval, rectangular, square or other desired shape. In some embodiments, the opposing edges of each of the probe pads 142 are either parallel or perpendicular to the longitudinal edges of the scribe line 113 (see FIG. 2C). In some embodiments, the probe pads 142 may be rotated such that the opposing edges thereof are not aligned with the longitudinal edges of a scribe line 113. The probe pads 142 are illustrated for clarity and simplicity, but such example is intended to be illustrative only, and is not intended to be limiting to the embodiments. A person ordinarily skilled in the art would readily understand that any suitable number of the probe pads 142 may alternatively be utilized, and all such combinations are fully intended to be included within the scope of the embodiments. Additionally, while the probe pads 142 are illustrated as having similar features, this is intended to be illustrative and is not intended to limit the embodiments, as the probe pads 142 may have similar structures or different structures in order to meet the desired functional capabilities.

The test device 160 is designed to monitor different process parameters or to evaluate different device structures and circuit products of the wafer W. In some embodiments, the test device 160 is selected from a group consisting of MOS devices, field MOS devices, diode devices, capacitors, resistors, inductors, contact/via chains, gate/field dielectric integrity devices, reliability devices, memory devices, user designed application-specific circuit structures, and the like. In some embodiments, the test device 160 may be a device similar to a device formed in a die. In some embodiments, the test device 160 is disposed in the dielectric stack 141, and a distance from the test device 160 to the semiconductive substrate 140 is less than the distance from the probe pads 142 to the semiconductive substrate 140. In some embodiments, the test device 160 is disposed in the semiconductive substrate 140 and located between adjacent two of the probe pads 142. In some embodiments, the test device 160 may overlap the probe pad 142 from a top view.

In some embodiments, the test devices 160 can formed in the test line area 120 shown in FIGS. 2B and 2C, and are electrically coupled to the corresponding probe pad 142 through the via string stacking 152. In some embodiments, the wafer acceptance test method M includes providing several test devices 160 distributed in a periphery region of the semiconductor die 111, 112, which is desired to be tested. A module of the test devices is selected and each test device of the selected module is respectively used for a test of a different property of the wafer, such as threshold voltage (VTH) or saturate current (IDSAT). The via string stacking 152 can be configured to electrically connect the test device 160 to the corresponding probe pad 142. In some embodiments, the via string stacking 152 can be configured to electrically connect the test device 160 to the probe pad 142. In some embodiments, each of the via string stacking 152 extends along a direction from a level of the probe pad 142 to the semiconductive substrate 140. In some embodiments, each of the probe pad 142 includes a periphery and a central portion surrounded by the periphery, each of the via string stacking 152 connects the periphery of the corresponding probe pad 142 to the test device 160, and the dielectric stack 141 is disposed between the semiconductive substrate 140 and the central portion of the probe pad 142. That is, only the via string stacking 152 and the dielectric stack 141 are disposed in the space between the corresponding probe pads 142 and the semiconductive substrate 140. In some embodiments, the probe pads 142 overlap the via string stacking 152 from a top view.

In some embodiments, each of the first via string stacking 152 includes a plurality of vias 153. That is, each of the via string stacking 152 is a via stack formed by a plurality of vias 153. In some embodiments, the conductive material included in each of the plurality of vias 153 may be the same or different. In some embodiments, the vias 153 of the via string stacking 152 are embedded in one or more sublayers of the dielectric stack 141. For each of the vias 153, a sublayer of the dielectric stack 141 is etched with a pattern, a conductive material is deposited over the sublayer, and a top portion of the deposited conductive material is removed by a chemical mechanical planarization (CMP) process. The overall process can be used to make the vias 153, while a dual damascene process can be used to make other interlayer connections.

In some embodiments, each of the probe pad 142 may includes conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the material included in the probe pad 142 may be the same or different. In some embodiments, each of the via string stacking 152 may include conductive material such as gold (Au), silver (Ag), copper (Cu), nickel (Ni), tungsten (W), aluminum (Al), tin (Sn), tantalum (Ta), tantalum nitride (TaN), aluminum copper (AlCu) and/or alloys thereof. In some embodiments, the material included in the via string stacking 152 may be the same or different. In some embodiments, the material included in the probe pad 142 and the via string stacking 152, may be the same or different.

Figure 3A:
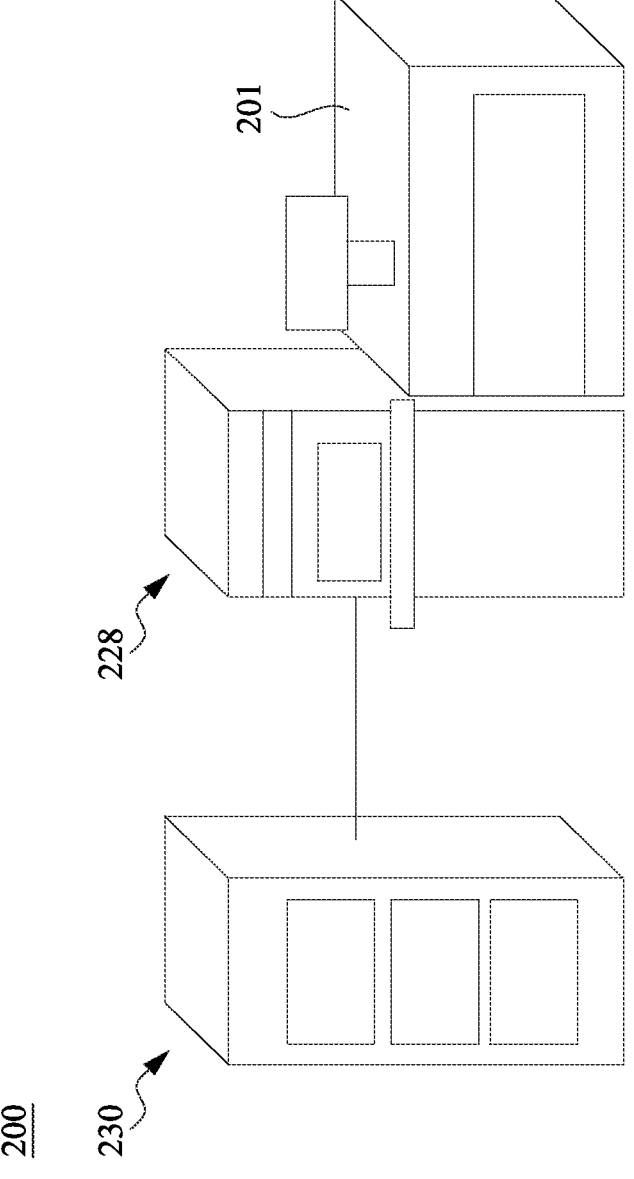
FIG. 3A illustrates a schematic view of a wafer acceptance test tool with an image inspection system in accordance with some embodiments of the present disclosure.
Figure 3B:
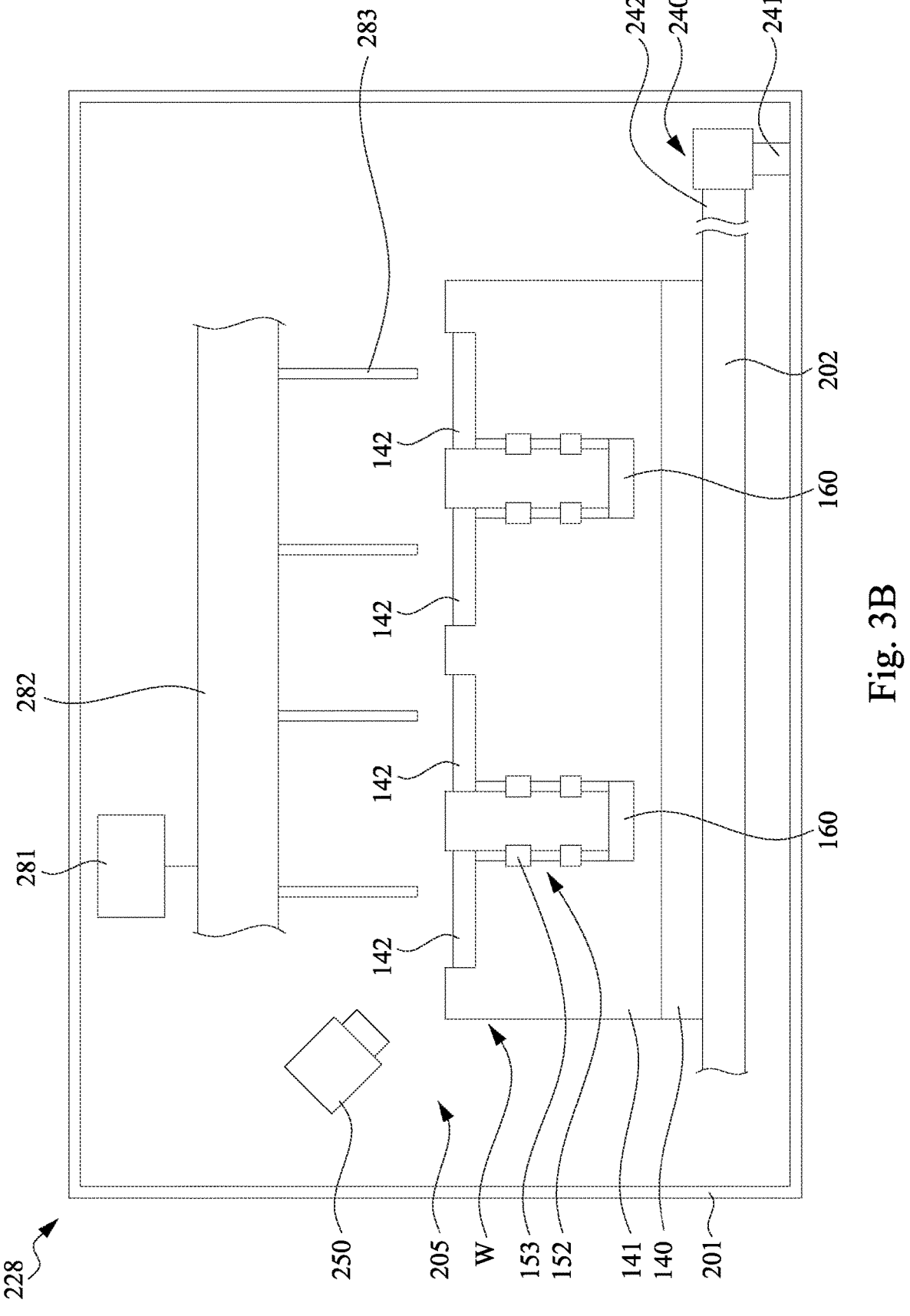
FIG. 3B illustrates a schematic view of a system for testing a semiconductor wafer by using a wafer acceptance test tool with an image inspection system in accordance with some embodiments of the present disclosure.

The method M begins at block S101 where a wafer is loaded into a chamber of a wafer acceptance test tool. Referring to FIGS. 3A and 3B, in some embodiments of block S101, the wafer W shown in FIG. 1A is loaded into a chamber 201 (see FIG. 3A) of the WAT system 228 and disposed over the wafer stage 202 (see FIG. 3B) in the chamber 201. In some embodiments, the wafer stage 202 is configured for holding, positioning, moving, and otherwise manipulating the wafer W during the testing process. In some embodiments, the wafer stage 202 can be interchangeably referred to as a wafer chuck. As shown in FIG. 3B, the WAT system 228 may further include a testing apparatus 281, a probe card 282, a positioning module 240, and a controller 260. A testing signal can be provided to the probe pad 142 by the testing apparatus 281 via the probes 283 of the probe card 282, and a response signal can be detected at the probe pads 142. Therefore, according to the response signal, the semiconductor structure can determine whether the test device 160 under test is normal. In some embodiments, the information of the response signal is analyzed, so as to analyze the manufacturing process of the wafer W. In some embodiments, the testing apparatus 281 can be interchangeably referred to as a tester. In some embodiments, the wafer stage 202, testing apparatus 281, and the probe card 282 including probes 283 can be collectively referred to as a prober.

In some embodiments, the wafer stage 202 can be mounted at the positioning module 240. The positioning module 240 can responsible for the movement and positioning of the wafer stage 202 in the chamber 201 relative to the probe 283. The positioning module 240 may include one or more driving element 245, a first drive mechanism 241, a second drive mechanism 242. The driving element 245, such as a motor, is controlled by a controller 260 and is coupled to the first drive mechanism 241 and the second drive mechanism 242. The driving element 245 can be used to actuate the first drive mechanism 241 and the second drive mechanism 242 to move in the vertical direction and the horizontal direction. In some embodiments, the driving element 245 can be used to actuate the first drive mechanism 241 and/or the second drive mechanism 242 to rotate about a vertical axis as well. In some embodiments, the driving element 245 is a programmable controller or the like. The controller 260 can initiate a relative motion between the wafer stage 202 and the probes 283, the relative motion may allow the probes 283 to press against probe pads 142 on the wafer W held on the wafer stage 202 to form probe marks on the probe pads 142. In some embodiments, the relative motion initiated by the controller 260 is moving the wafer stage 202 while keeping the probes 283 stationary. In some embodiments, the relative motion initiated by the controller 260 includes moving the wafer stage 202 vertically and horizontally. In some embodiments, the controller 260 can include a central processing unit (CPU), a memory, and support circuits, e.g., input/output circuitry, power supplies, clock circuits, cache, and the like. The memory is connected to the CPU. The memory is a non-transitory computable readable medium, and can be one or more readily available memory such as random access memory (RAM), read only memory (ROM), floppy disk, hard disk, or other form of digital storage. In addition, although illustrated as a single computer, the controller 260 can be a distributed system, e.g., including multiple independently operating processors and memories.

Returning to FIG. 1A, the wafer acceptance test method M then proceeds to block S102 where the wafer is aligned relative to a wafer stage in the chamber. With reference to FIGS. 3A and 3B, in some embodiments of block S102, the wafer stage 202 utilizes mechanical alignment mechanisms to achieve initial alignment of the wafer W. These mechanisms may include notch 103 (see FIG. 2A) or other alignment features that ensure proper orientation and placement of the wafer W on the wafer stage 202. Subsequently, an image sensor 250 (see FIG. 3B) integrated into the WAT system 228 is employed to perform further alignment of the wafer W. The image sensor 250 may utilize imaging technology, such as cameras or optical sensors, to capture images of the wafer's fiducial marks or other alignment features.

The image sensor 250 is located at the interior space 205 of the chamber 201. In some embodiments, the image sensor 250 has a field of view (FOV) covering the wafer stage 202, so that the image sensor 250 can capture an image of a wafer W held by the wafer stage 202. In some embodiments, the image sensor 250 is mounted at the chamber 201. In some embodiments, the image sensor 250 includes a charge-coupled device (CCD). The CCD is a highly sensitive photon detector. The CCD is divided into a large number of small, light-sensitive areas (known as pixels) which can be used to build up an image of the scene of interest. A photon of light that falls within the area defined by one of the pixels will be converted into one (or more) electrons, and the number of electrons collected will be directly proportional to the intensity of the scene at each pixel. When the CCD is clocked out, the number of electrons in each pixel is measured and the scene can be reconstructed.

The captured images from the image sensor 250 are processed using advanced AI-based image analysis algorithms. These algorithms analyze the position, orientation, and alignment of the fiducial marks or alignment features on the wafer W. Based on the analysis of the captured images, the image processing algorithms calculate the necessary adjustments required to align the wafer W. This calculation takes into account the deviation and displacement of the fiducial marks or alignment features from the desired alignment position. The wafer W is then adjusted and positioned based on the calculated alignment corrections. The wafer W may employ motorized or robotic actuators to make the required adjustments, ensuring that the wafer is aligned with accuracy. Once the alignment adjustments are made, the alignment accuracy is verified using the image system. The fiducial marks or alignment features are re-imaged, and the resulting images are compared with the desired alignment position. If necessary, iterative adjustments can be made until the desired alignment accuracy is achieved.

Returning to FIG. 1A, the wafer acceptance test method M then proceeds to block S103 where a probe of the wafer acceptance test tool is aligned relative to the wafer. With reference to FIGS. 3A and 3B, in some embodiments of block S103, the position of the probe 283 is aligned relative to the wafer stage 202 to ensure a preset distance between them. This alignment process is for maintaining the desired spacing and ensuring accurate testing. The testing apparatus 281 incorporates a positioning module 240 (see FIG. 3A) in the chamber 201 that enables controlled movement of the wafer stage 202. These positioning module 240 allow for adjustments along the X, Y, and Z axes to align the probes 283 with the wafer stage 202. Using the positioning module 240, the probe 283 is moved towards the wafer stage 202 with incremental adjustments. The movement is carefully controlled to ensure precise alignment and maintain the preset distance between the probe 283 and the wafer stage 202. During the alignment process, distance calibration techniques are employed to measure and verify the actual distance between the probes 283 and the wafer stage 202. This calibration ensures that the achieved distance aligns with the preset value. The alignment process often involves iterative steps with feedback loops. Feedback from the image sensor 250 or a distance sensor (not shown) is utilized to monitor the alignment and make adjustments to achieve the desired spacing. The process continues until the preset distance is accurately maintained. By following this alignment process, the position of the probe 283 relative to the wafer stage 202 in the WAT system 228 can be precisely aligned to ensure the desired distance between them. The use of positioning mechanisms, calibration techniques, and iterative feedback loops allows for accurate alignment, which is for reliable and consistent testing of the wafer.

Returning to FIG. 1A, the wafer acceptance test method M then proceeds to block S104 where the position of the center semiconductor die on the wafer is confirmed. With reference to FIGS. 3A and 3B, in some embodiments of block S104, The image sensor 250 can capture image of the wafer surface, ensuring that the center region, where the target semiconductor die is located. The captured image can be processed using advanced AI-based image analysis algorithms. These algorithms analyze the image data, detect the outlines or boundaries of the semiconductor dies, and identify the center semiconductor die based on predefined criteria. The image processing algorithms localize the center semiconductor die by calculating its coordinates and orientation relative to the reference points or fiducial marks on the wafer W. This information is used to determine the exact position and rotation of the center semiconductor die. Once the position of the center semiconductor die is confirmed, fine alignment adjustments can be made to align the center semiconductor die with the testing apparatus 281, including the probe pads 142. The positioning module 240 (see FIG. 3A) in the wafer acceptance test tool 200 can be used to make these adjustments.

Returning to FIGS. 1A and 1B, the wafer acceptance test method M then proceeds to block S105 wherein the positions of the probes relative to the probe pads are automatically adjusted, which encompasses a series of sub-blocks: S1051, S1052, S1053, S1054, and S1055. These sub-blocks are designed to align the position of the probes 283 of the WAT system 228 relative to the probe pads 142.

Figure 4A:
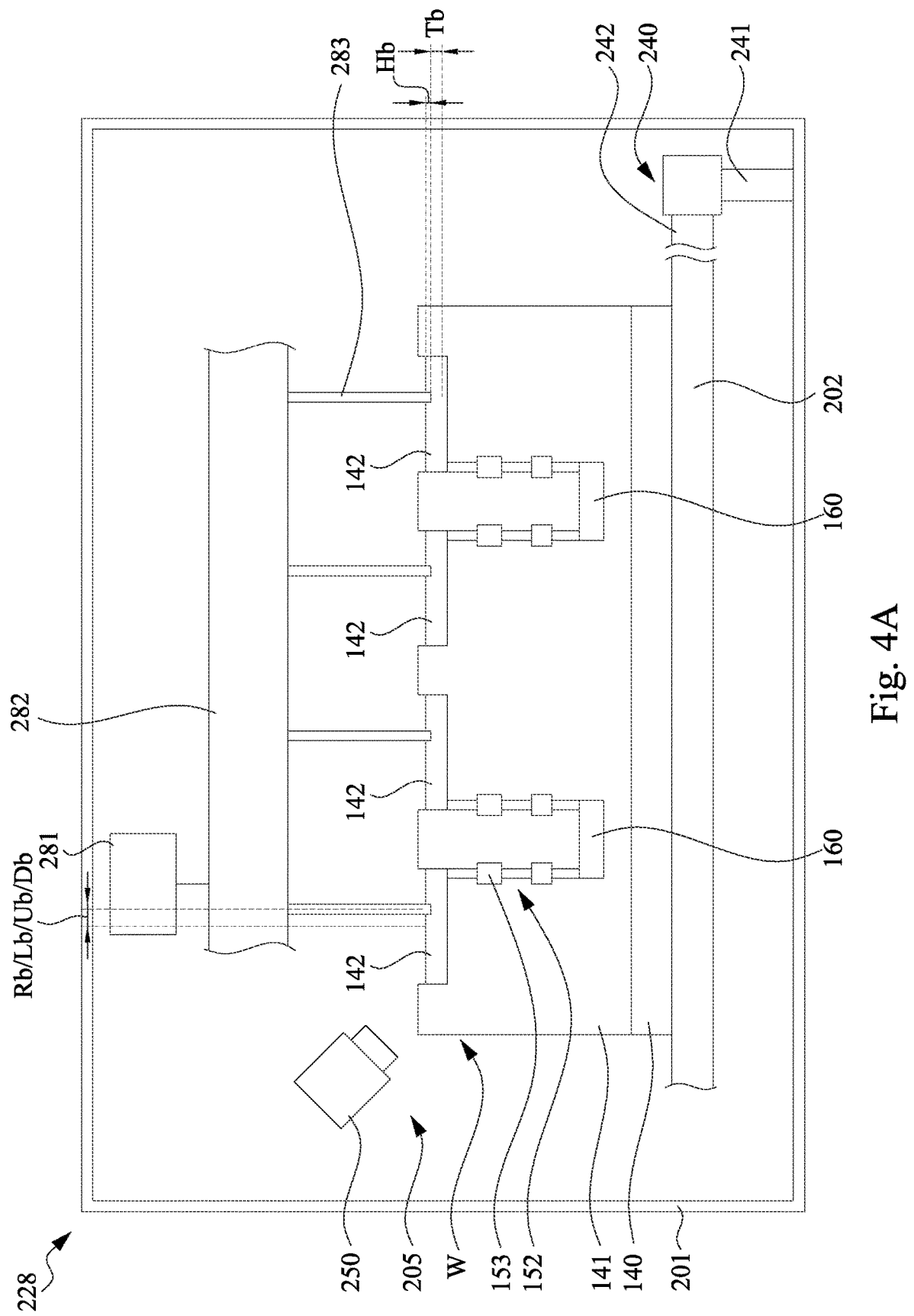
FIGS. 4A and 4B illustrate schematic views of wafer acceptance tests for semiconductor wafers in accordance with some embodiments of the present disclosure.
Figure 4B:
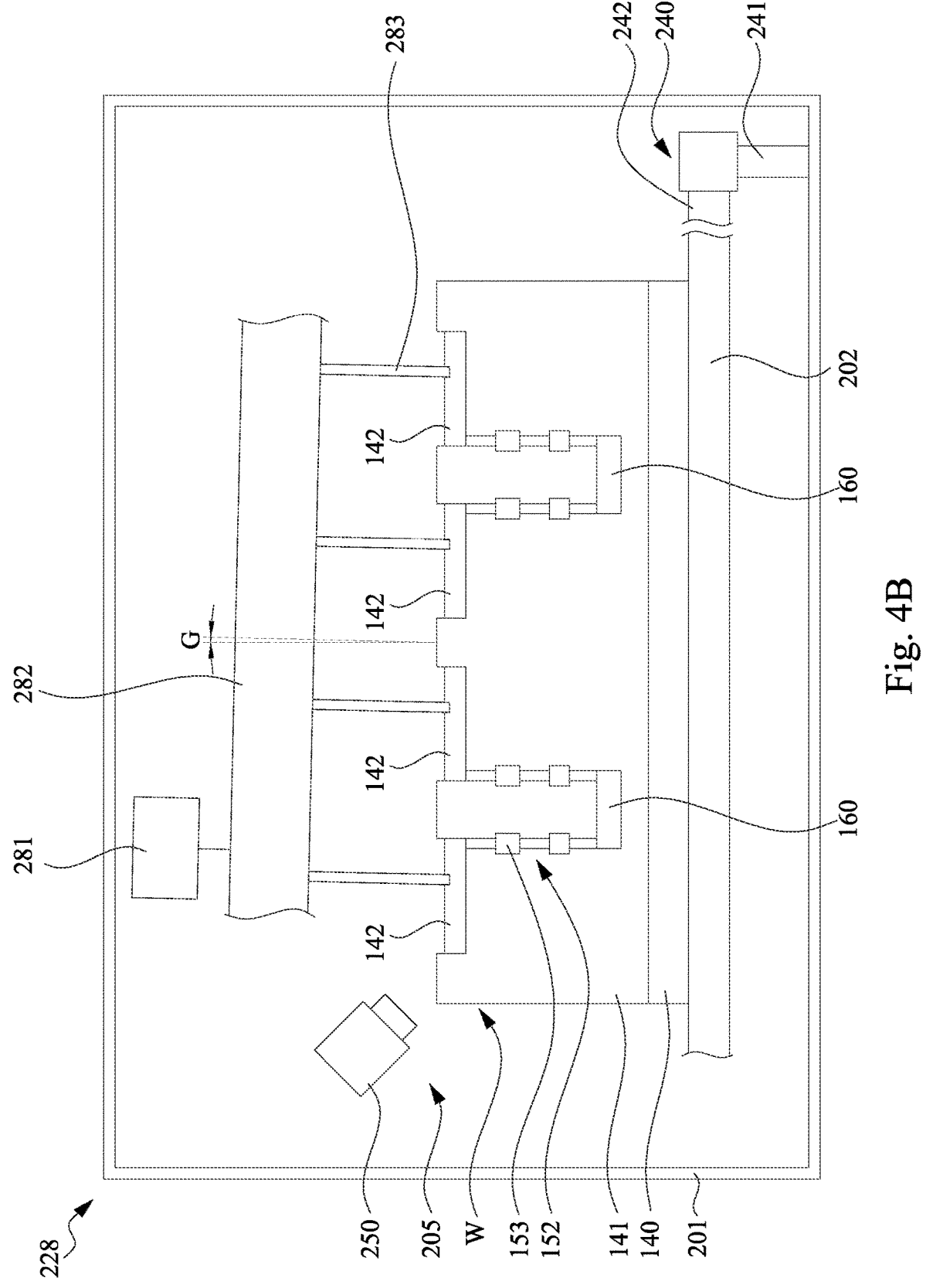
Figure 4C:
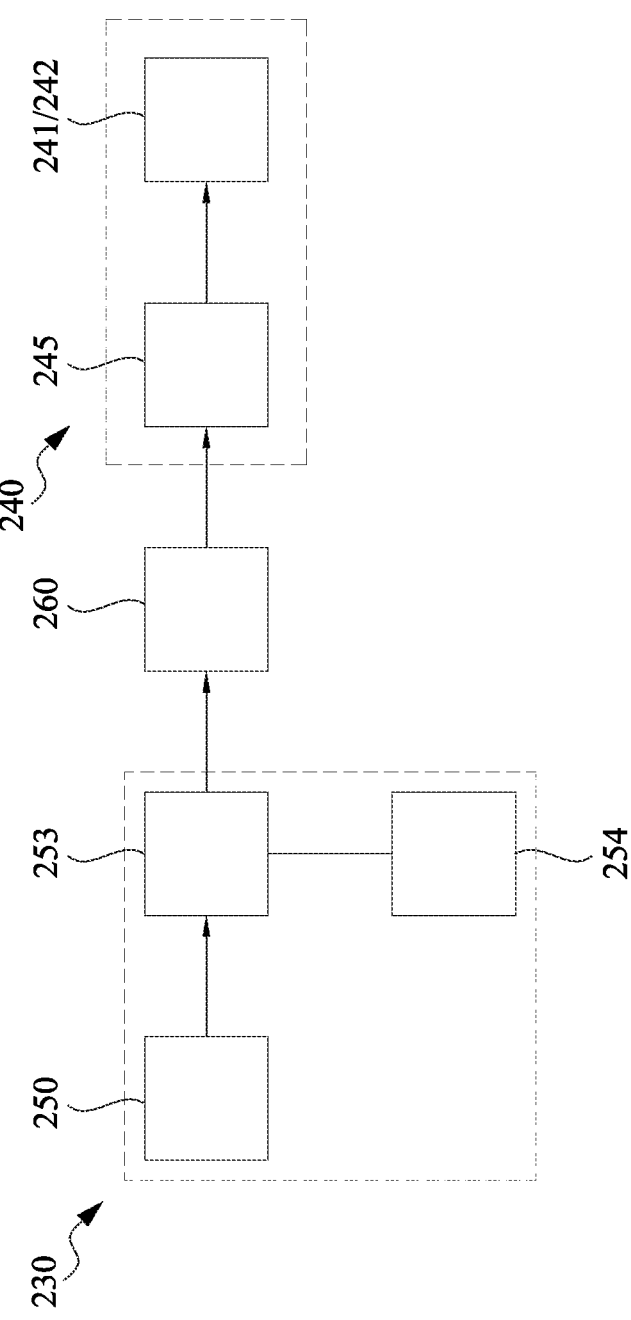
FIG. 4C illustrates a block diagram of a wafer acceptance test tool with an image inspection system in accordance with some embodiments of the present disclosure.

Returning to FIG. 1B, the wafer acceptance test method M then proceeds to block S1051 where the probes are pressed against the probe pads at a first pressed against position to obtain probe marks on the probe pads. With reference to FIGS. 4A and 4C, in some embodiments of block S1051, the probes 283 of the testing apparatus 281 in the WAT system 228 can be brought into contact with the corresponding probe pads 142 on the test line 120 around the center semiconductor die. This allows for the transmission of testing signals and the measurement of response signals to assess the characteristics and performance of the semiconductor devices on the wafer W (e.g., center semiconductor die).

Specifically, the probes 283 are pressed against the probe pads 142 to establish physical contact and obtain probe marks (e.g., probe marks M1 shown FIG. 4D) on the probe pads 142. The pressing of the probes against the probe pads 142 can be carried out using controlled force or pressure. This force is applied to ensure proper electrical contact between the probes 283 and the probe pads 142, allowing for the transfer of signals and data during the test. As the probes 283 make contact with the probe pads 142, they leave probe marks on the surface of the probe pads 142. These probe marks serve as indicators of the contact points and can be observed or detected using the IIM system 230 (see FIG. 3A), including image sensor 250 (see FIG. 4A). The presence of probe marks can confirm that the probes 283 have successfully made contact with the probe pads 142. Obtaining probe marks on the probe pads 142 is a step in the wafer acceptance test method M to verify the physical connection between the probes 283 and the probe pads 142, ensuring that the test signals can be accurately transmitted and received. The presence of probe marks can also provide an indication of successful contact, allowing for subsequent analysis and interpretation of the test results.

However, if the probes 283 are not aligned to the center of the probe pad 142 but close to the edge of the probe pad 142, it can potentially have adverse effects on the measurement results. For example, if the probe 283 is not aligned with the center of the probe pad 142, the contact between the probe 283 and the probe pad 142 may not be optimal. This can result in inconsistent electrical contact or partial contact, leading to unreliable measurements. The electrical resistance and signal integrity may be affected, causing deviations in the measured response signals. In addition, improper alignment can introduce additional parasitic effects, such as increased capacitance or inductance between the probe 283 and the probe pad 142. These parasitic effects can distort the testing signals and the response signals, making it challenging to accurately interpret the measurements and evaluate the device's performance. Furthermore, when the probe 283 is close to the edge of the probe pad 142, there is a higher likelihood of signal loss or attenuation. The signal may not propagate effectively through the semiconductor structure and reach the test device 160, resulting in weakened response signals. This can lead to inaccurate measurements and a loss of sensitivity in detecting device behavior.

To mitigate these adverse effects, automatically precise alignment of the probes 283 to the center of the probe pad 142 can be reach by the wafer acceptance test method M. This ensures optimal electrical contact, minimizes parasitic effects, and maximizes signal integrity. Proper alignment based on the probe mark detection can improve the accuracy and reliability of the measurement results, enabling a more accurate assessment of the device's characteristics and performance. To enhance the efficiency and accuracy of probe mark detection on the probe pad 142, artificial intelligence (AI) techniques can be employed. AI algorithms can analyze the images stored in the database and automatically identify the boundary (or outline) of the probe mark (e.g., probe marks M1 shown FIG. 4D) from the probe pad 142. This allows for precise localization and measurement of the probe mark M1, facilitating subsequent analysis and evaluation.

Returning to FIG. 1B, the wafer acceptance test method M then proceeds to block S1052 where images of the probe marks on the probe pads are captured and the images are uploaded (or transmitted) to an image inspection machine (IIM) system. With reference to FIGS. 4A and 4C, in some embodiments of block S1052, the image sensor 250 (see FIG. 4A), such as a camera or microscope, captures images of the probe pads 142 containing the probe marks M1 as shown FIG. 4D, and the image data is transferred to the image processor 253 of the IIM system 230 for further processing. The image processor 253 is connected to the image sensor 250 to receive the captured image from the image sensor 250. Then, the image processor 253 can compare the image captured by the image sensor 250 to reference images stored in a reference image database 254 and thus produce a comparison result. The comparison result can be used to calibrate the position of the probe 283 will be discussed in greater detail below with respect to FIGS. 4D-4P.

Figures 5A, 5B, 5C, 5D, 5E:
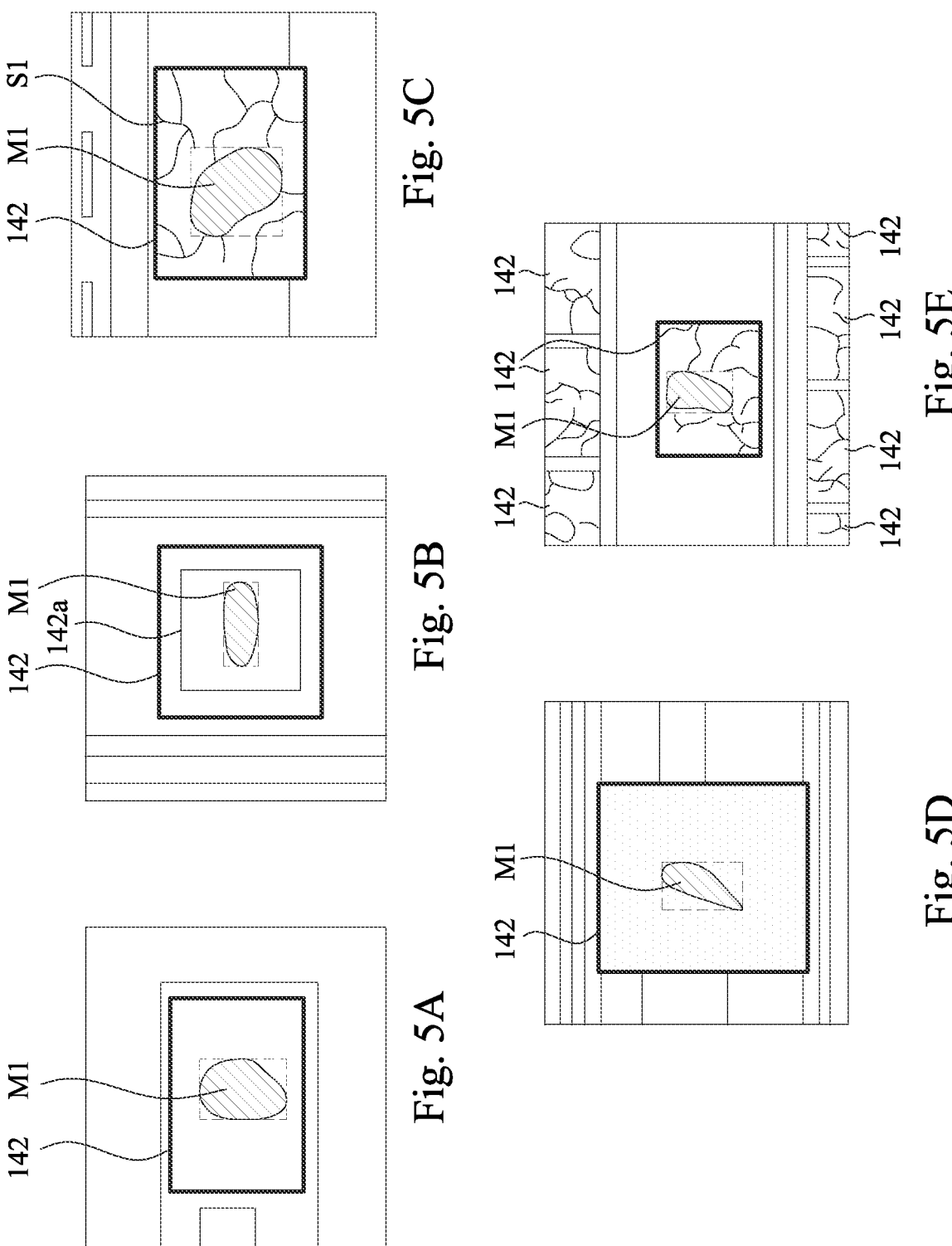

In some embodiments, the material and outline of the probe pad can vary between different tests, which can result in variations in the appearance of the probe mark M1 caused by the probe pressing on the probe pad. These variations can affect the captured images (see FIGS. 5A-5E) of the probe pad and probe mark, making it challenging to accurately detect and analyze them. For example, in the captured images by the image sensor 250, there are distinct color differences between the probe pad and probe mark M1 in FIG. 5A. In FIG. 5B, an additional indirect probe pad region 142*a* is observed between the probe pad 142 and probe mark M1. FIG. 5C shows surface patterns S1 on the probe pad. In FIG. 5D, the color difference between the probe pad and probe mark M1 is minimal. FIG. 5E depicts multiple probe pads 142 densely arranged in close proximity. Therefore, to address this challenge and reduce the time required for probe calibration, the methods including AI training, image analysis, and boundary localization can be employed.

Figure 4D:
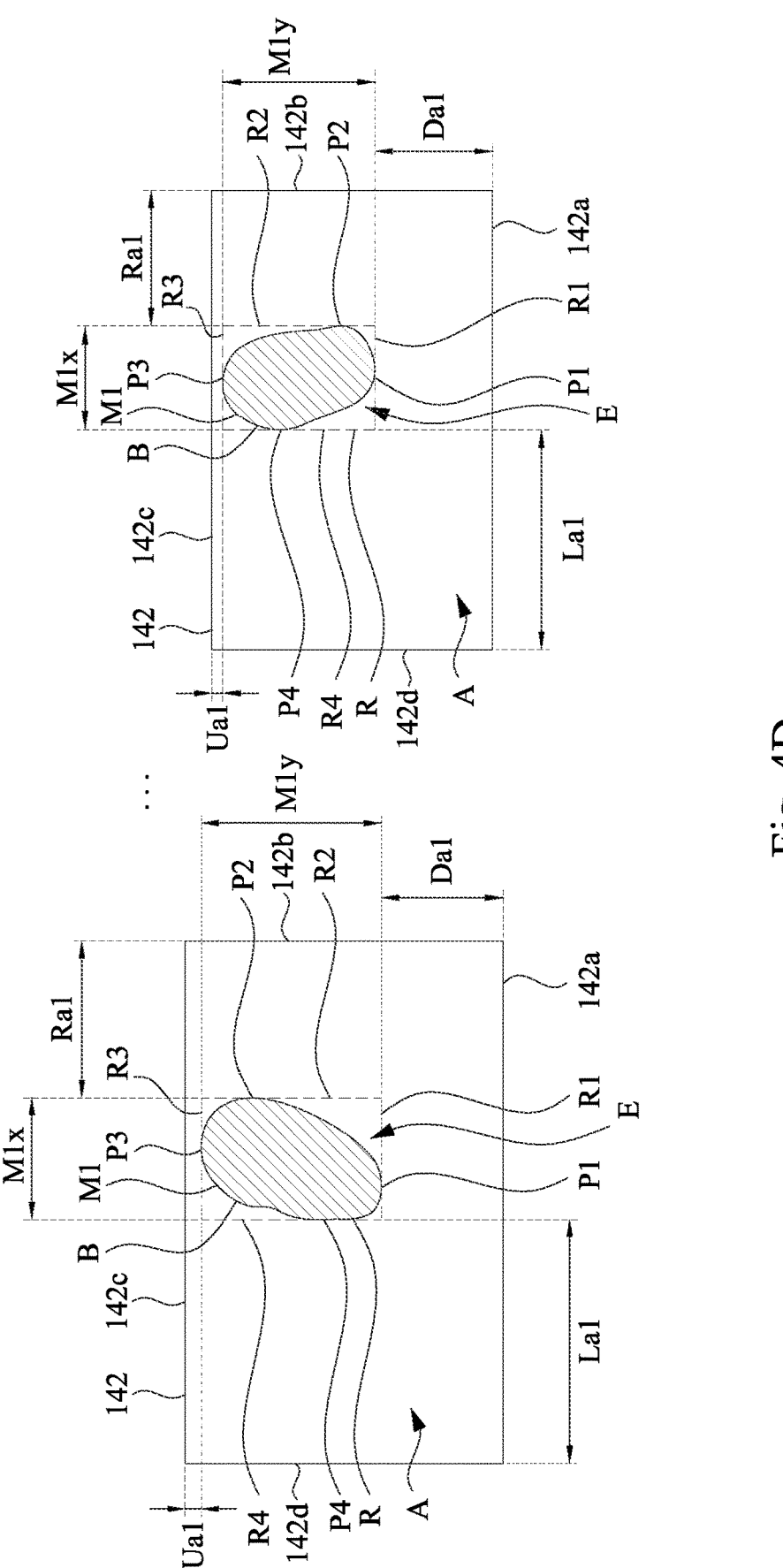

Returning to FIG. 1B, the wafer acceptance test method M then proceeds to block S1053 where whether the sizes and the positions of the probe marks on the probe pads are acceptable by the IIM system is determined. With reference to FIGS. 4A, 4C, and 4D, in some embodiments of block S1053, a reference image database 254 (see FIG. 4C) of the IIM system 230 is provided. The reference image database 254 may contain a collection of pre-captured images of probe marks M1 on probe pads. These images serve as a reference for training the AI algorithm to recognize and detect probe marks M1 on probe pads in the captured images. The AI algorithm is trained using machine learning techniques on the reference image database 254 of probe mark images and on probe pad images. The algorithm learns to recognize patterns and features that indicate the presence and boundary of the probe marks M1 on the probe pads.

In some embodiments, the training process may include data collection, data annotation, feature extraction, model selection, training process, and validation and iteration. Specifically, the dataset of images containing probe marks M1 on probe pads is collected. These images can be obtained through manual capture or by using automated imaging systems. Subsequently, each image in the dataset is annotated with labels or bounding boxes that indicate the location and boundaries of the probe marks M1 and the probe pads. This annotation process requires manual or semi-automatic labeling, where human experts mark the probe mark M1 regions and the probe pad regions in the images. Subsequently, various features are extracted from the annotated images to represent the characteristics of the probe marks M1 and the probe pad. These features may include color, texture, shape, or other relevant attributes that can help distinguish the probe marks M1 from the background (e.g. probe pad). Subsequently, a suitable machine learning model or algorithm can be chosen for training the AI system, such as convolutional neural networks (CNNs). Subsequently, the model can be trained using the annotated dataset, where it learns to associate the extracted features with the labeled probe marks M1 and the probe pads. This is typically done through an optimization process, such as gradient descent, where the model adjusts its internal parameters to minimize the difference between predicted and actual probe mark boundaries and to minimize the difference between predicted and actual probe pad boundaries. Subsequently, the trained model can be evaluated on a separate validation dataset to assess its performance. If necessary, the training process is iterated, refining the model's parameters or architecture to improve accuracy and generalization.

When the image of the probe pad 142 (see FIG. 4A) containing the probe mark (e.g., probe marks M1 shown FIG. 4D) is captured by the image sensor 250 (see FIG. 4A), the AI algorithm can be applies its learned knowledge to analyze the captured image and detect the probe marks M1 and the probe pad 142. The algorithm may identify the boundaries (e.g., boundaries B on the left and right probe pads 142 as shown in FIG. 4D) of all the probe marks M1 based on the features it has learned during training. The AI-based image analysis may include an image preprocessing to enhance its quality and facilitate subsequent analysis. This may include operations such as resizing, noise reduction, contrast adjustment, or normalization. Similar to the training phase, relevant features are extracted from the preprocessed image. These features capture the visual cues to identify the probe mark M1 and the probe pad 142, such as color contrasts or texture variations. The AI model analyzes the image and predicts the presence and boundaries of the probe marks M1 on the probe pads 142 based on the extracted features. It identifies regions in the image that correspond to the probe mark M1 and the probe pad 142 and outputs their positions or boundary information.

Once edges or boundaries are detected, boundary localization can aim to precisely determine the boundaries (e.g., boundaries B on the left and right probe pads 142 as shown in shown FIG. 4D) of the detected probe marks (e.g., probe marks M1 shown FIG. 4D) and the detected probe pad 142 within the image. This step is for accurately measuring the size, shape, and position of the probe marks M1 and the probe pads 142. For example, an image segmentation algorithm can be applied to the detected image to separate the probe marks M1 from the background (e.g. probe pad 142) by clustering or classifying pixels based on their intensity, color, or texture. This process results in a binary or grayscale mask where the probe marks M1 are represented as distinct regions. Similarly, an edge detection algorithm and/or a contour tracing algorithm can aim to precisely determine the boundaries of the detected probe marks M1 within the image. Specifically, the edge detection algorithm (e.g., gradient-based approach like Sobel or Roberts operator) can identify abrupt changes or gradients in pixel intensities, which correspond to the boundaries of the probe marks M1. The contour tracing algorithm can be applied to identify and trace the continuous boundary lines of the probe marks M1. Therefore, by combining the AI training, the image analysis, and the boundary localization, the system can effectively handle the variations in probe pad materials and outlines. They enable the system to efficiently process and interpret the captured images, resulting in accurate detection and localization of probe marks and the probe pad 142, ultimately reducing the time needed for further probe calibration.

Subsequently, the detected boundaries (e.g., boundaries B shown FIG. 4D) of the probe marks (e.g., probe marks M1 shown FIG. 4D) and the probe pad 142 are transmitted and stored (or recorded) in the reference image database 254 (see FIG. 4C) for further analysis and processing. This can involve storing the coordinates or geometric information of the probe mark boundaries B. Specifically, after obtaining the boundaries, the next step is to determine whether the calibration of the probe 283 is performed at the horizontal position or whether the calibration of the probe 283 is performed at the vertical direction relative to the top surface of the wafer stage 202. To facilitate this determination, virtual boxes (e.g., virtual boxes R shown FIG. 4D) are defined on the probe pads 142, respectively, to precisely encompass the probe marks M1. These virtual boxes R help establish reference boundaries for the probe marks M1. Once the virtual boxes R are established (or generated), the distances between the corresponding sides of the virtual boxes R and the corresponding probe pads 142 are measured. The determination of the position or size relationship between the virtual box R and probe pad 142 can be used to decide whether further actions are required, such as proceeding with "automatically adjusting the positions of the probes based on the analysis result from the IIM system" for block S1054, initiating "start testing the characteristics of the wafer" for block S106, or notifying the wafer acceptance test tool 200 of the abnormal configuration of probe 283, requiring a shutdown for inspection. That is, in response to the determination determines that the identified probe marks M1 are acceptable, a wafer acceptance test is performed to the wafer W with the probes 283 at the original pressed against position on the probe pads 142. On the other hand, in response to the determination determines that the identified probe marks M1 are not acceptable, an adjustment parameter is generated through the image inspection machine to adjust the pressed against position of the probes 283 on the probe pads 142.

By way of example and not limitation, the virtual boxes R (see FIG. 4D) are constructed in such a way that its four sides are parallel to the corresponding sides of the probe pads 142. Specifically, the probe pads 142 can be arranged in a row along the extension direction of the test line area 120 (see FIG. 2C), with multiple probe pads present. The probe pad 142 (see FIG. 4D) has four sides, 142a, 142b, 142c, and 142d. The side 142a is parallel to the side 142c, while the side 142b is parallel to side 142d. The virtual box R has sides R1 and R3, which represent the maximum dimensions M1x (see FIG. 4D) along the extension of the probe mark (e.g., probe mark M1 shown FIG. 4D) in the direction of the side 142a of the probe pad 142. The virtual box R has sides R2 and R4, which represent the maximum dimensions M1y (see FIG. 4D) along the extension of probe mark M1 in the direction of the side 142b of the probe pad 142.

In particular, distances Ra1, La1, Ua1, and Da1 (see FIG. 4D) represent the measurements between the four sides R1, R2, R3, and R4 of virtual box R1 and the corresponding sides 142a, 142b, 142c, and 142d of the probe pad 142. However, an alternative approach is also possible. These distances can also be determined by measuring the distances between the closest points P1, P2, P3, and P4 (see FIG. 4D) on probe mark (e.g., probe mark M1 shown FIG. 4D) and the respective sides 142a, 142b, 142c, and 142d of the probe pad 142. By identifying the closest points P1, P2, P3, and P4 on the probe mark M1 and the probe pad 142, we can measure the distances Ra1, La1, Ua1, and Da1 on the probe pad 142, which provide valuable information for assessing the alignment and deviation of the probe marks relative to the probe pad 142.

Specifically, the distances Ra1, La1, Ua1, and Da1 (see FIGS. 4D-4P) on the probe pad 142 can be used to analyze the probe marks M1 and determine if there is any bias in the horizontal direction or in the vertical direction for the probe 283, as well as to identify whether it is a leftward or rightward bias, or an upward or downward bias.

Figure 4E:
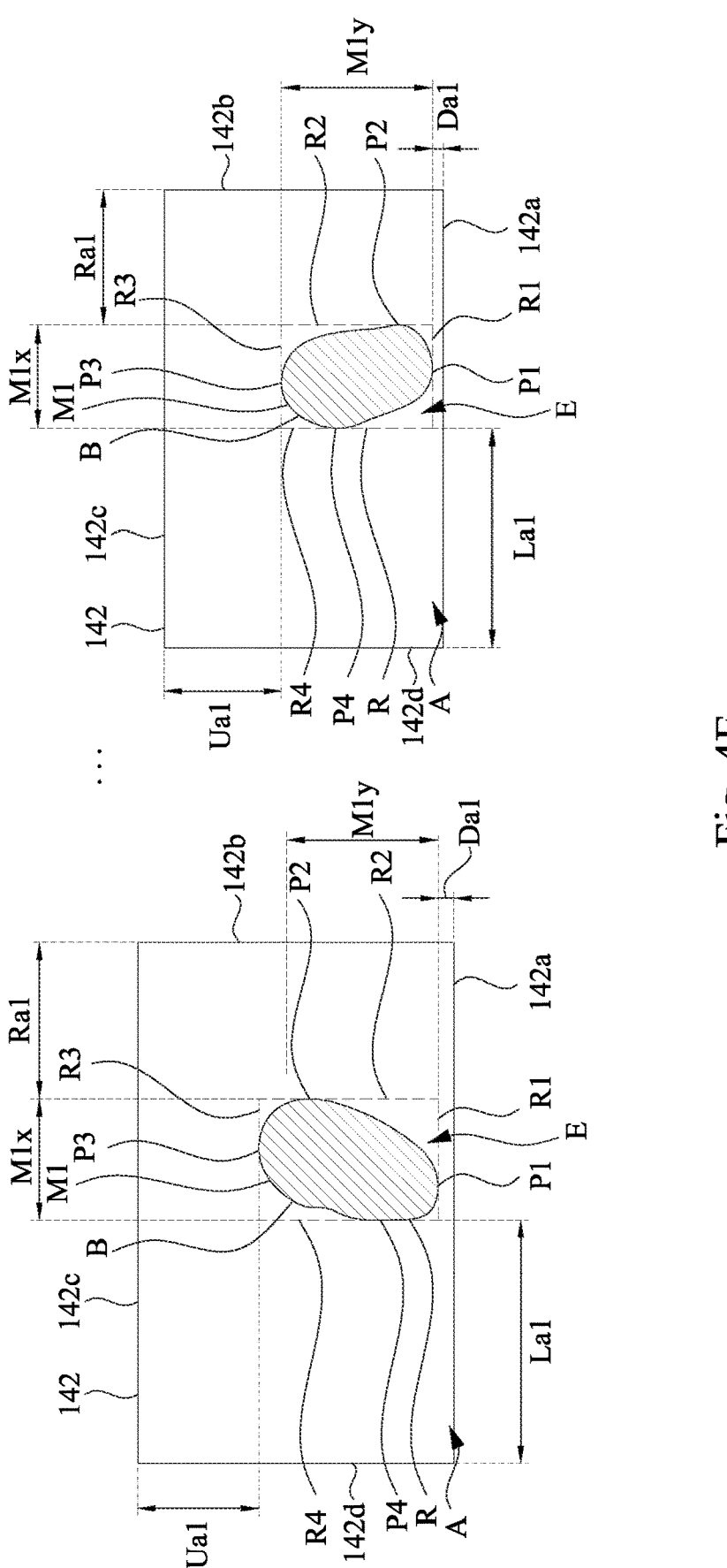

As shown in FIGS. 4D and 4E, if the difference between the distances Ra1 and La1 on the probe pad 142 is found to be less than a first predetermined threshold value, it indicates that the probe marks M1 as shown in FIGS. 4D and 4E do not exhibit a horizontal deviation relative to the probe pads 142 along the side 142a of the probe pad 142. This means that the alignment of the probes 283 along the side 142a of the probe pad 142 is within an acceptable tolerance, ensuring accurate positioning for the wafer acceptance test in the horizontal direction along the side 142a of the probe pad 142.

Figure 4F:
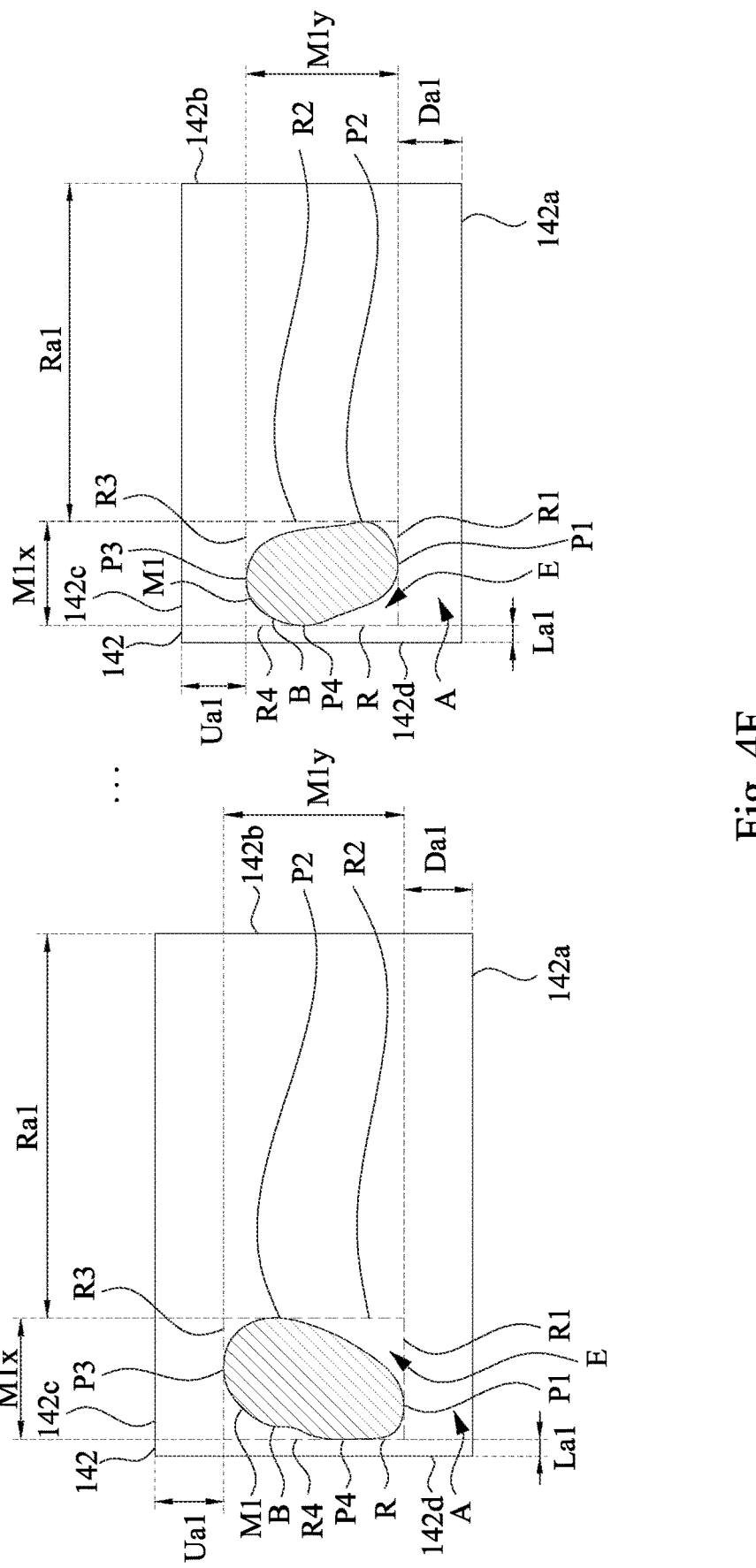
Figure 4G:
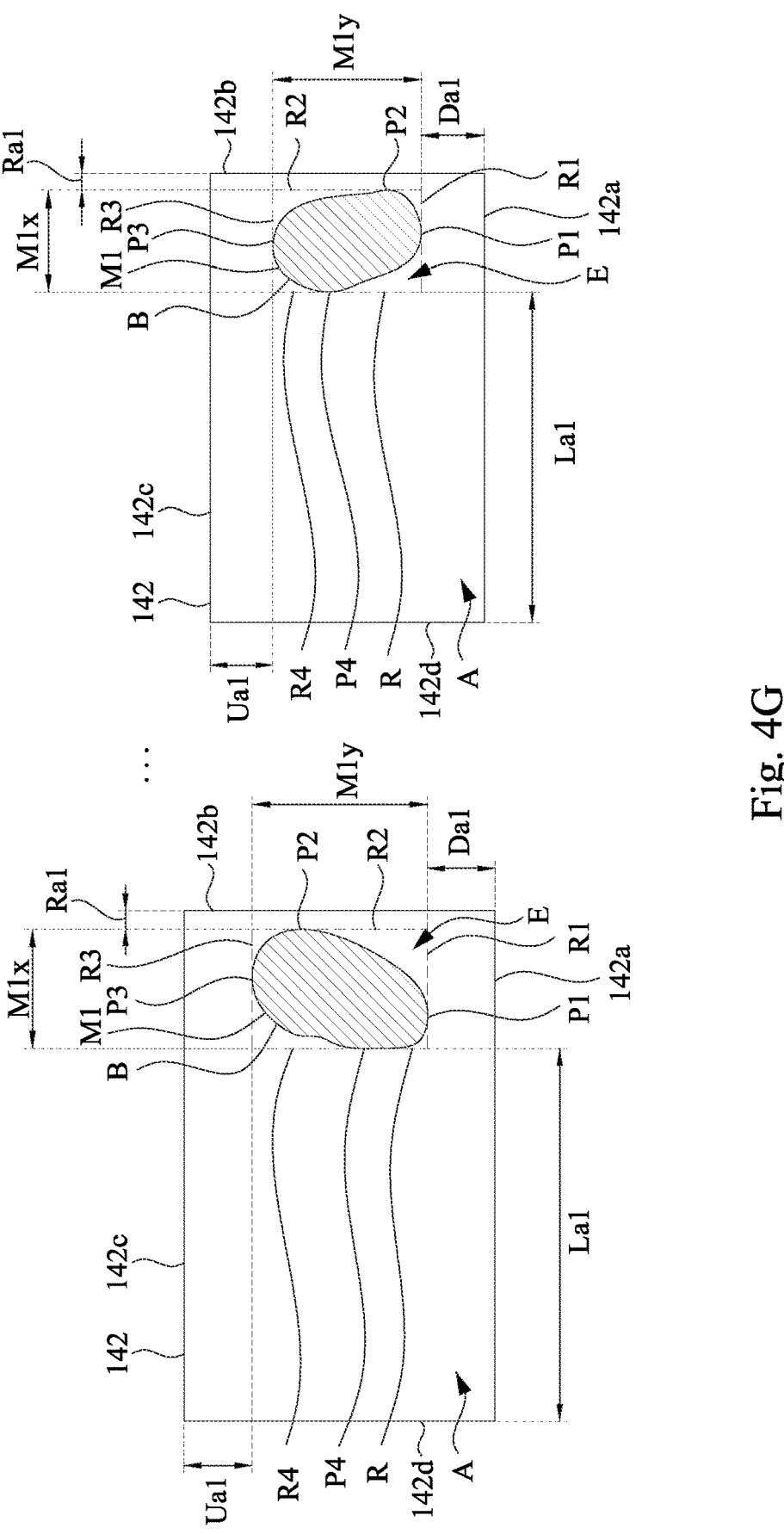
Figure 4H:
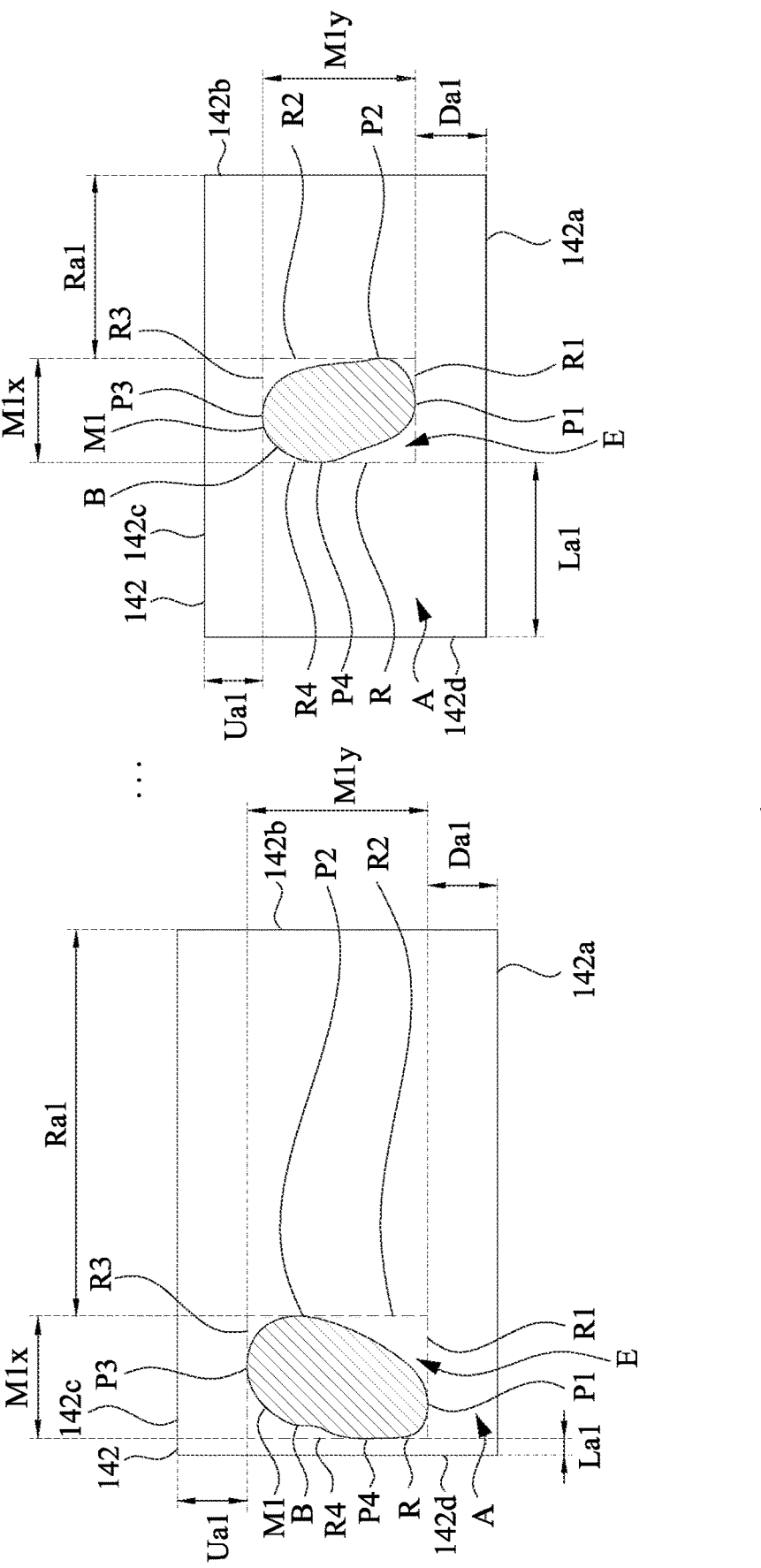
Figure 4I:
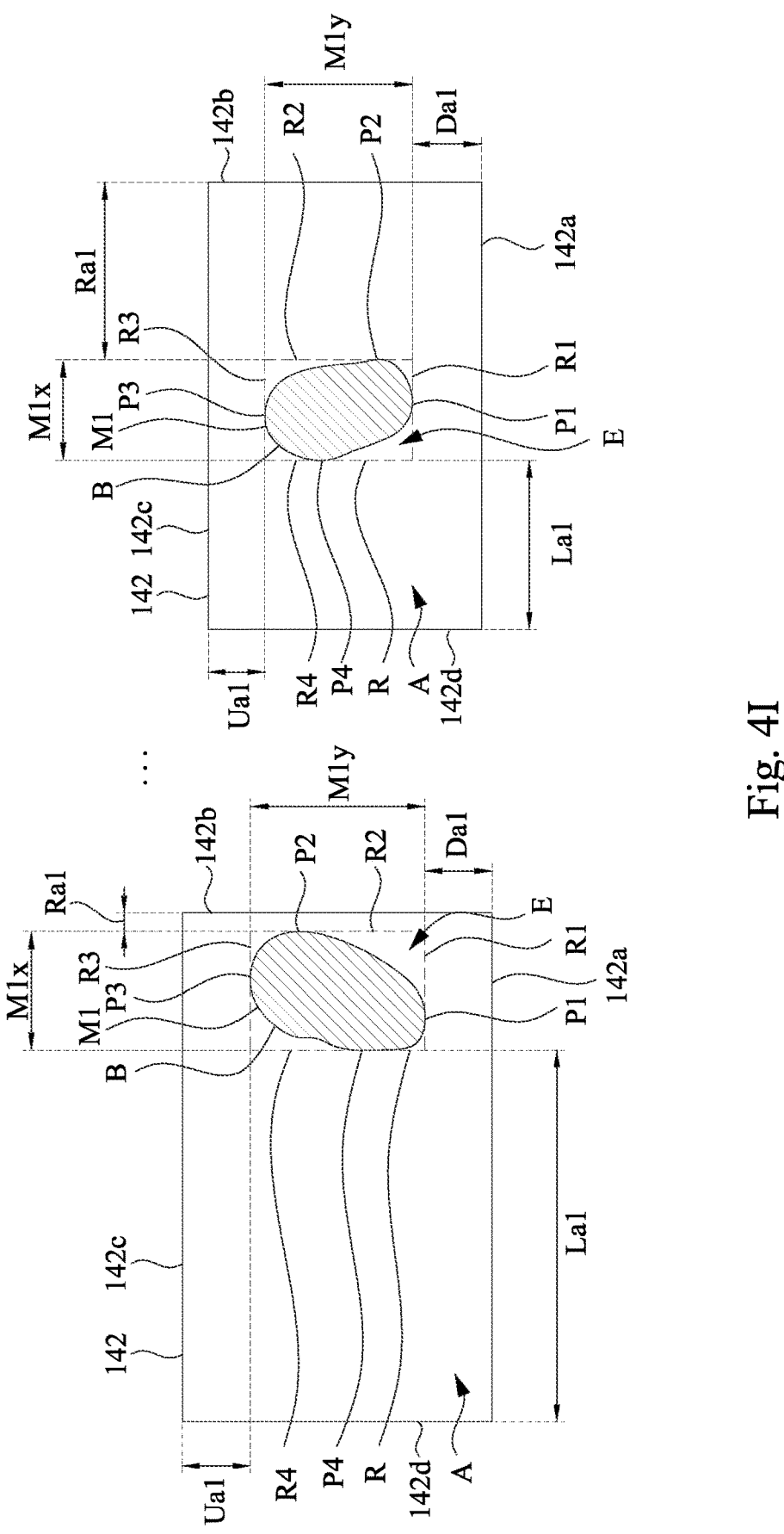

As shown in FIGS. 4F-4I, when the difference between the distances Ra1 and La1 on at least one of the probe pads 142 exceeds a first predetermined threshold value, it indicates horizontal deviations of the probe marks M1 as shown in FIGS. 4F-4I relative to the probe pads 142 along the side 142a of the probe pads 142. In such cases, there are specific conditions to consider: the distances Ra1 are greater than distances La1 on all of the probe pads 142 (see FIG. 4F), or the distances Ra1 are less than distances La on all of the probe pads 142 (see FIG. 4G). If the other difference is below the predetermined threshold value, it is not necessary to fulfill the condition where distances Ra1 are greater than distances La1 on all of the probe pads 142, or where distances Ra1 are smaller than distances La1 on all of the probe pads 142 (see FIGS. 4H and 4I). This difference signifies a misalignment or shift of the probe marks M1 towards the left side (see FIGS. 4F and 4H) or right side (see FIGS. 4G and 4I) of the probe pads 142 compared to their expected position. Specifically, as shown in FIGS. 4F and 4H, if the distances Ra1 exceed the distance La1 by at least the first predetermined threshold value, it suggests that the probe marks M1 are biased towards the left side of the probe pads 142, indicating a leftward bias. Conversely, as shown in FIGS. 4G and 4I, if the distance La1 exceeds the distance Ra1 by at least the first predetermined threshold value, it indicates a rightward bias.

Figure 4J:
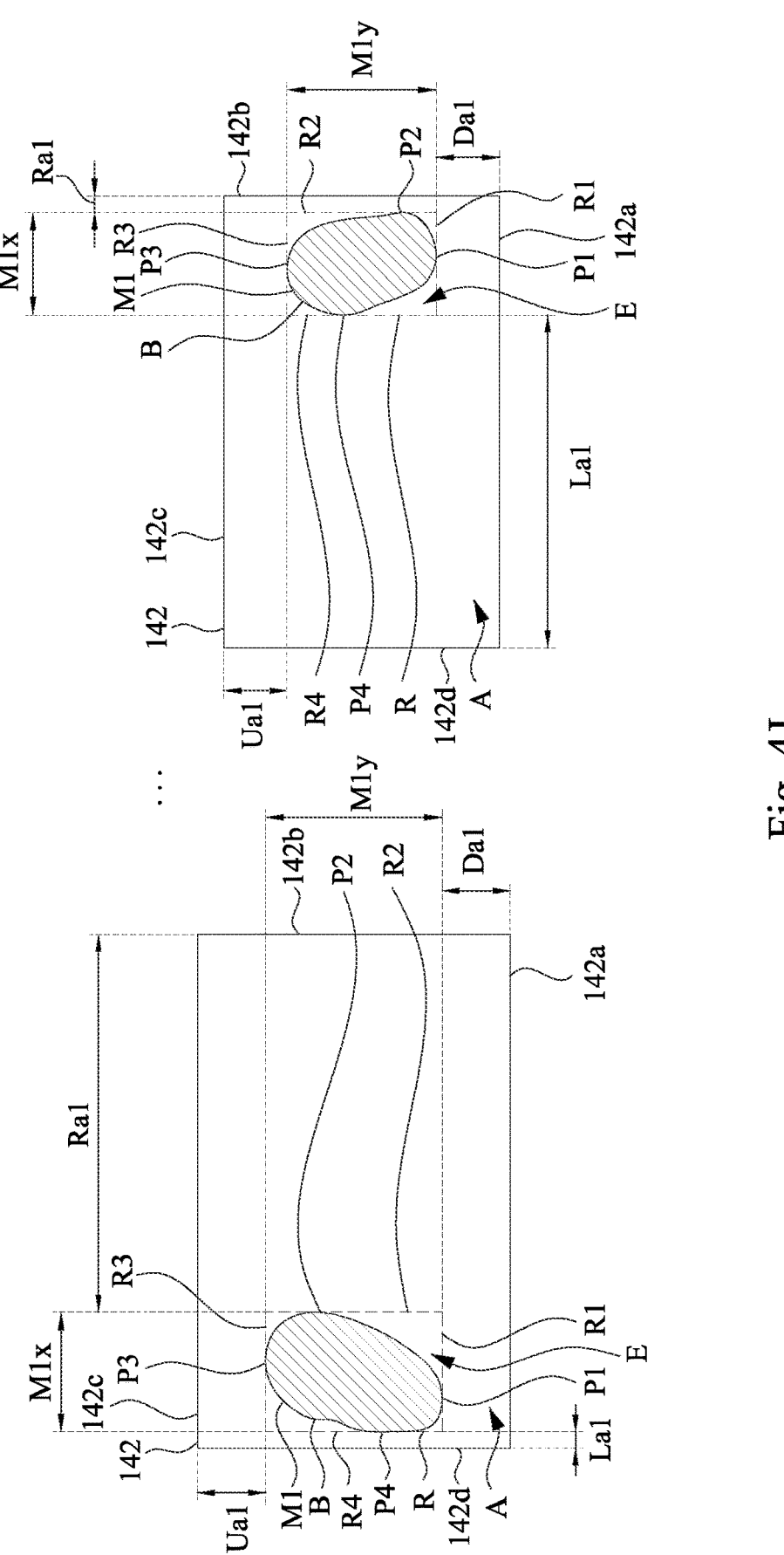

Furthermore, as shown in FIG. 4J, if the difference between the distance Ra1 and La1 on at least a first one of the probe pads 142 (e.g., the left probe pad 142 shown in FIG. 4J) exceeds the first predetermined threshold value, and simultaneously, the difference between the distance Ra and La on at least a second one of the probe pads 142 (e.g., the right probe pad 142 shown in FIG. 4J) also exceeds the first predetermined threshold value, but the distances Ra1 on the first and second ones of the probe pads 142 are not simultaneously greater than or less than the distances La1, it suggests a configuration issue with the probes 283. This indicates that the probe marks M1 as shown in FIG. 4J exhibit an inconsistent horizontal deviation across the probe pads 142 along the side 142a of the probe pad 142. In such cases, the IIM system 230 will send a signal to the WAT system 228, indicating the need for checking the configuration of the probes 283. This signal serves as a signal that there may be misalignment or other irregularities in the positioning of the probes 283, affecting their proper functioning and accurate testing of the wafer W.

Similarly, as shown in FIGS. 4F and 4G, if the difference between the distances Ua1 and Da1 on the probe pad 142 is less than the second predetermined threshold value, it indicates that the probe marks M1 as shown in FIGS. 4E and 4G do not have horizontal deviations relative to the probe pads 142 along the side 142b of the probe pad 142. This means that the alignment of the probes 283 along the side 142b of the probe pad 142 is within an acceptable tolerance, ensuring accurate positioning for the wafer acceptance test in the horizontal direction along the side 142b of the probe pad 142.

As shown in FIGS. 4D, 4E, 4K, and 4L, when the difference between the distances Ua1 and Da1 on at least one of the probe pads 142 exceeds a second predetermined threshold value, it indicates horizontal deviations of the probe marks M1 as shown in FIGS. 4D, 4E, 4K, and 4L relative to the probe pads 142 along the side 142a of the probe pads 142. In such cases, there are specific conditions to consider: the distances Ua1 are greater than distances Da1 on all of the probe pads 142 (see FIG. 4E), or the distances Ua1 are less than distances Da1 on all of the probe pads 142

Figure 4K:
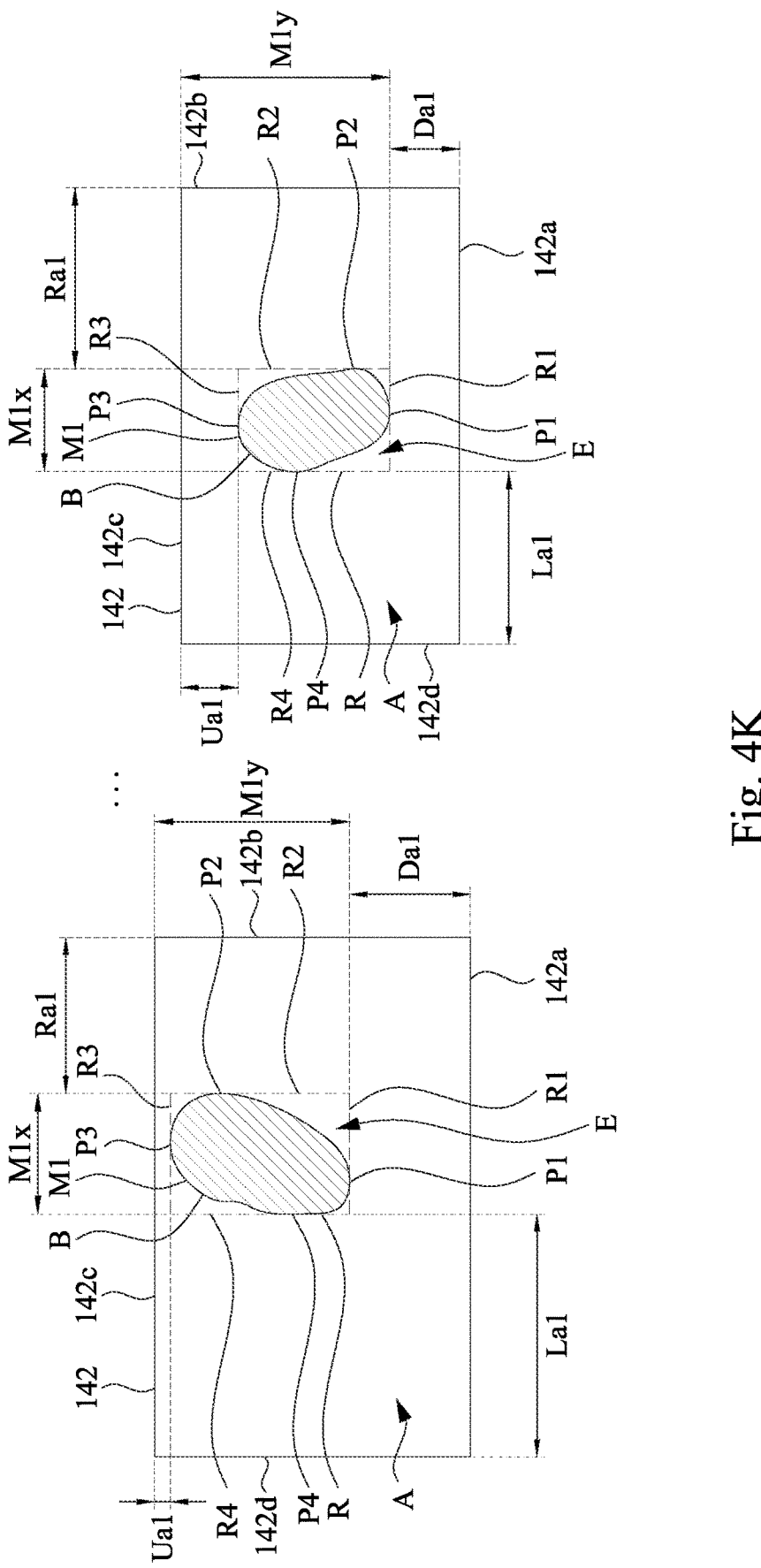
Figure 4L:
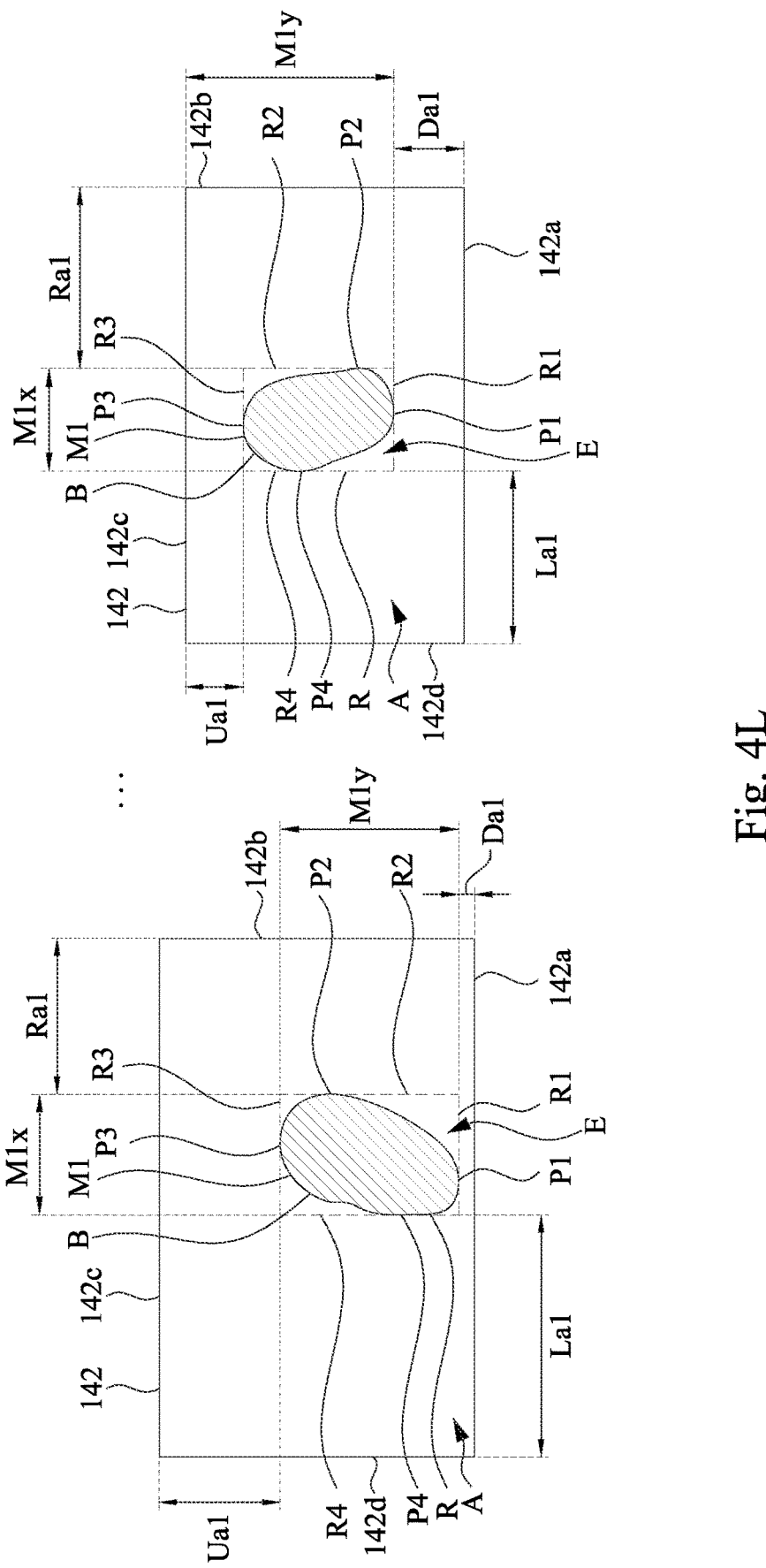

(see FIG. 4D). If the other difference is below the second predetermined threshold value, it is not necessary to fulfill the condition where distances Ua1 are greater than distances Da1 on all of the probe pads 142, or where distances Ua1 are both smaller than distances Da1 on all of the probe pads 142 (see FIGS. 4K and 4L). This difference signifies a misalignment or shift of the probe marks M1 towards the upper side (see FIGS. 4D and 4K) or the lower side (see FIGS. 4E and 4L) of the probe pads 142 compared to their expected position. Specifically, as shown in FIGS. 4E and 4L, if the distance Ua1 exceeds the distance Da1 by at least the second predetermined threshold value, it suggests that the probe marks M1 are biased towards the lower side of the probe pads 142, indicating a downward bias. Conversely, as shown in FIGS. 4D and 4K, if the distance Da1 exceeds the distance Ua1 by at least the second predetermined threshold value, it indicates an upward bias.

Figure 4M:
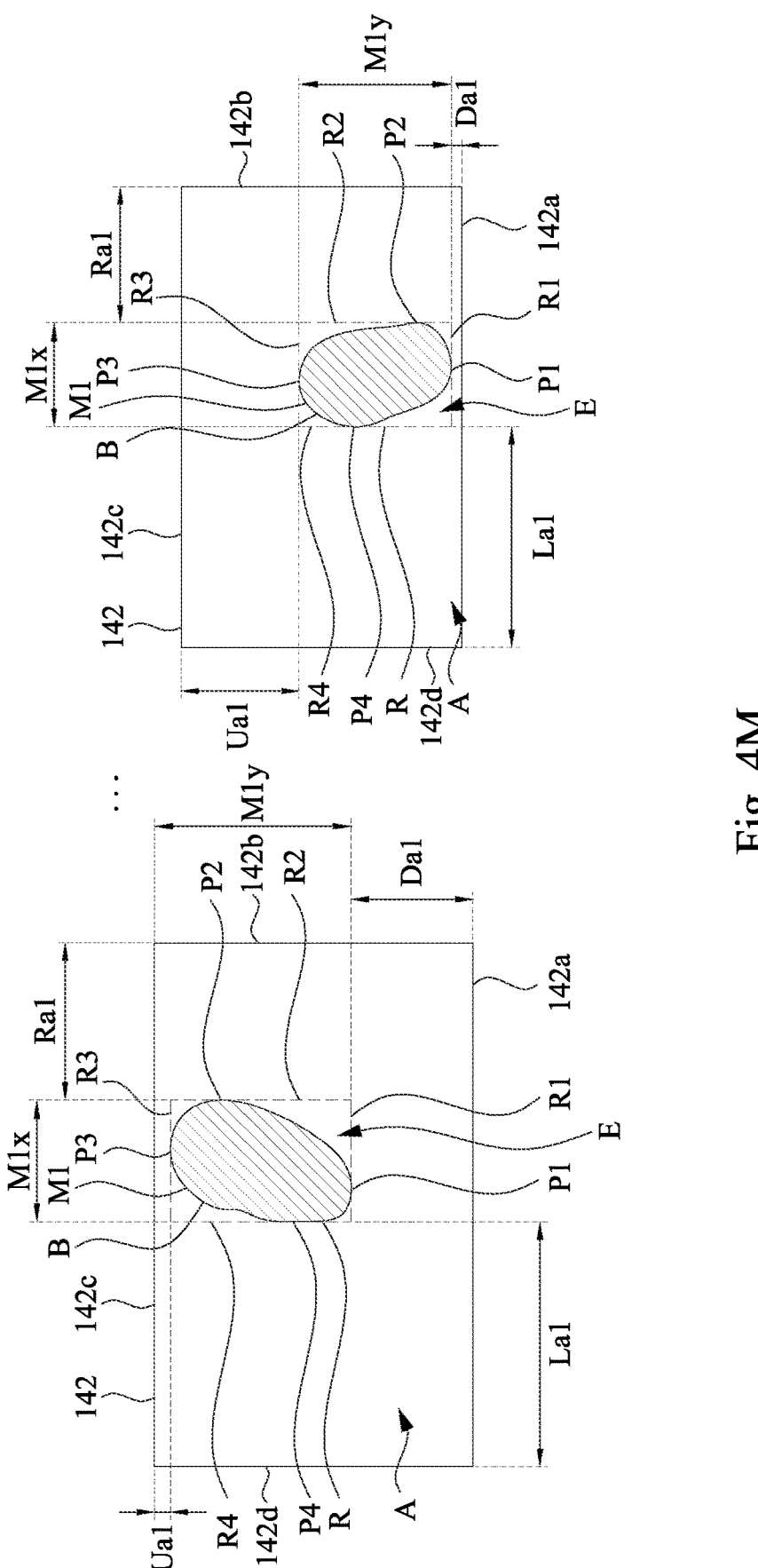

Furthermore, as shown in FIG. 4M, if the difference between the distance Ua1 and Da1 on at least a firs one of the probe pads 142 (e.g., the left probe pad 142 shown in FIG. 4M) exceeds the second predetermined threshold value, and simultaneously, the difference between the distance Ua and Da on at least a second one of the probe pads 142 (e.g., the right probe pad 142 shown in FIG. 4M) exceeds the second predetermined threshold value, but the distances Ua1 on the first and second ones of the probe pads 142 are not simultaneously greater than or less than the distances Da1, it indicates a configuration issue with the probes 283. This indicates the probe marks M1 as shown in FIG. 4M exhibit an inconsistent horizontal deviation of the probe marks M1 across the probe pads 142 along the side 142b of the probe pad 142. In such cases, the IIM system 230 will send a signal to the WAT system 228, indicating the need to check the configuration of the probes 283. This signal serves as a signal that there may be misalignment or other irregularities in the positioning of the probes 283, affecting their proper functioning and accurate testing of the wafer W.

By comparing the distances Ra1, La1, Ua1, and Da1 in the image, it can determine the presence of bias and identify whether it is a leftward, rightward, upward, or downward bias in the horizontal direction. This information can guide further adjustments or calibrations to ensure proper alignment and accurate testing during the wafer acceptance process.

In some embodiments, the first predetermined threshold may be defined in a range from about 0.05 to 0.3 times of the dimension of the side 142a of the probe pad 142, such as about 0.05, 0.1, 0.15, 0.2, 0.25, or 0.3. The second predetermined threshold value can be defined about 0.05 to 0.3 times of the dimension of the side 142a of the probe pad 142, such as about 0.05, 0.1, 0.15, 0.2, 0.25, or 0.3. Alternatively, in some embodiments, a fixed threshold of about 2 to 4 μm, such as 2, 2.5, 3, 3.5, or 4 um, can be set as the first and second predetermined threshold values to determine the deviations of the probe marks M1 relative to the probe pads 142. In some embodiments, the second predetermined threshold can be the same as the first predetermined threshold. In some embodiments, the second predetermined threshold can be different than the first predetermined threshold.

On the other hand, the overall vertical deviation of probe marks M1 relative to probe pads 142 can be evaluated by comparing the areas E defined by the contours of virtual boxes R with the corresponding areas A of the probe pads 142. In some embodiments, an alternative approach involves directly utilizing the area defined by the contour of probe mark M1 on probe pad 142 for the calculation. Specifically, if a ratio of the area E to the area A falls within a range from a first predetermined threshold percentage to a second predetermined threshold percentage, it indicates that the probes 283 are positioned at a similar height compared to the expected level along the vertical direction and do not exhibit a vertical direction deviation relative to the probe pads 142. This indicates that the alignment of the probes 283 and the contact between the probe tips and the probe pads 142 are within an acceptable tolerance, ensuring accurate positioning for the wafer acceptance test in the vertical direction.

Figure 4N:
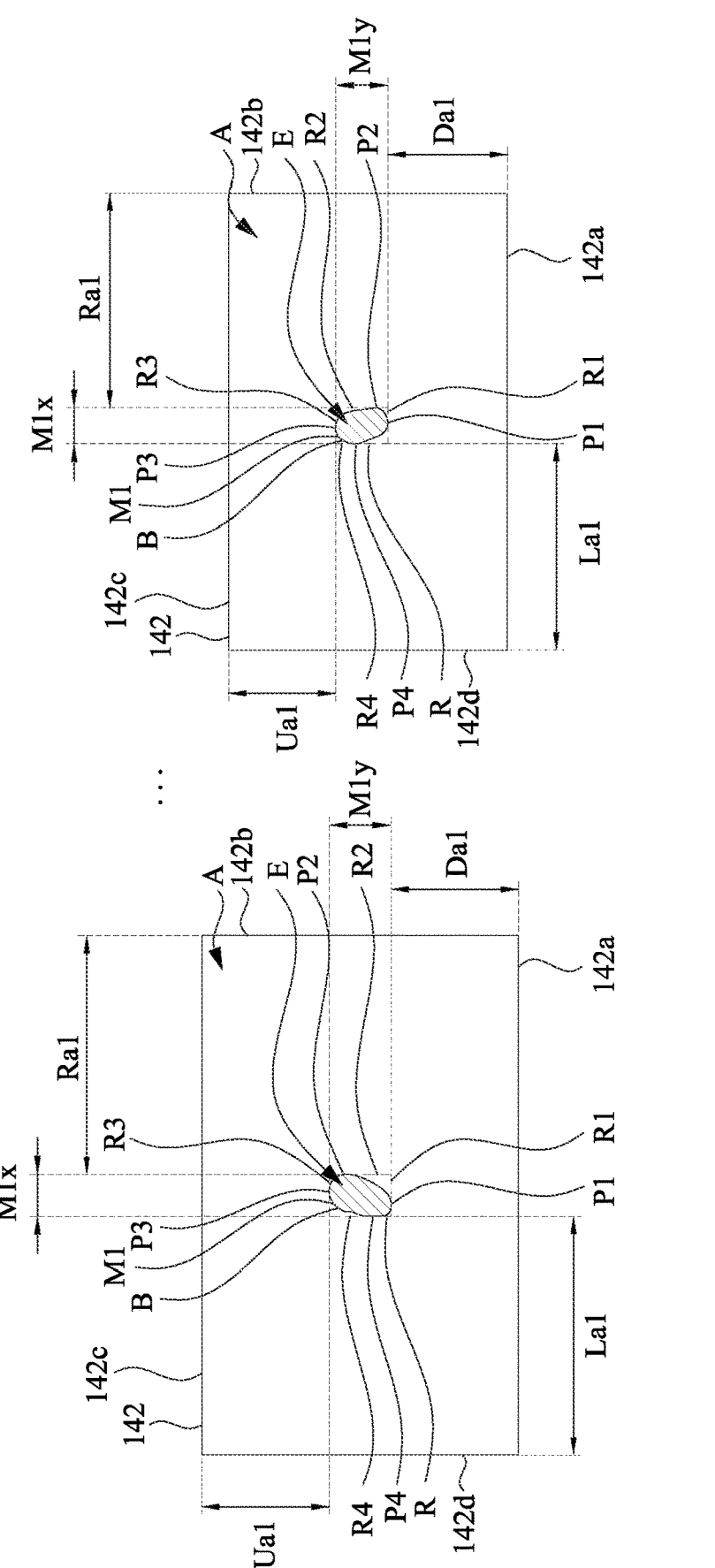

As shown in FIG. 4N, when the ratio of the area E to the area A is below the first predetermined threshold percentage, it indicates a vertical deviation of the probes 283 relative to the probe pads 142. This suggests that the probes 283 are positioned higher than the desired level along the vertical direction. In such cases, it is possible for the ratios on all of the probe pads 142 to be below the first predetermined percentage, or for at least one ratio on at least one of the probe pads 142 to be below the first predetermined percentage while the other ratio falls within a range from the first predetermined threshold percentage to the second predetermined threshold percentage.

Figure 4O:
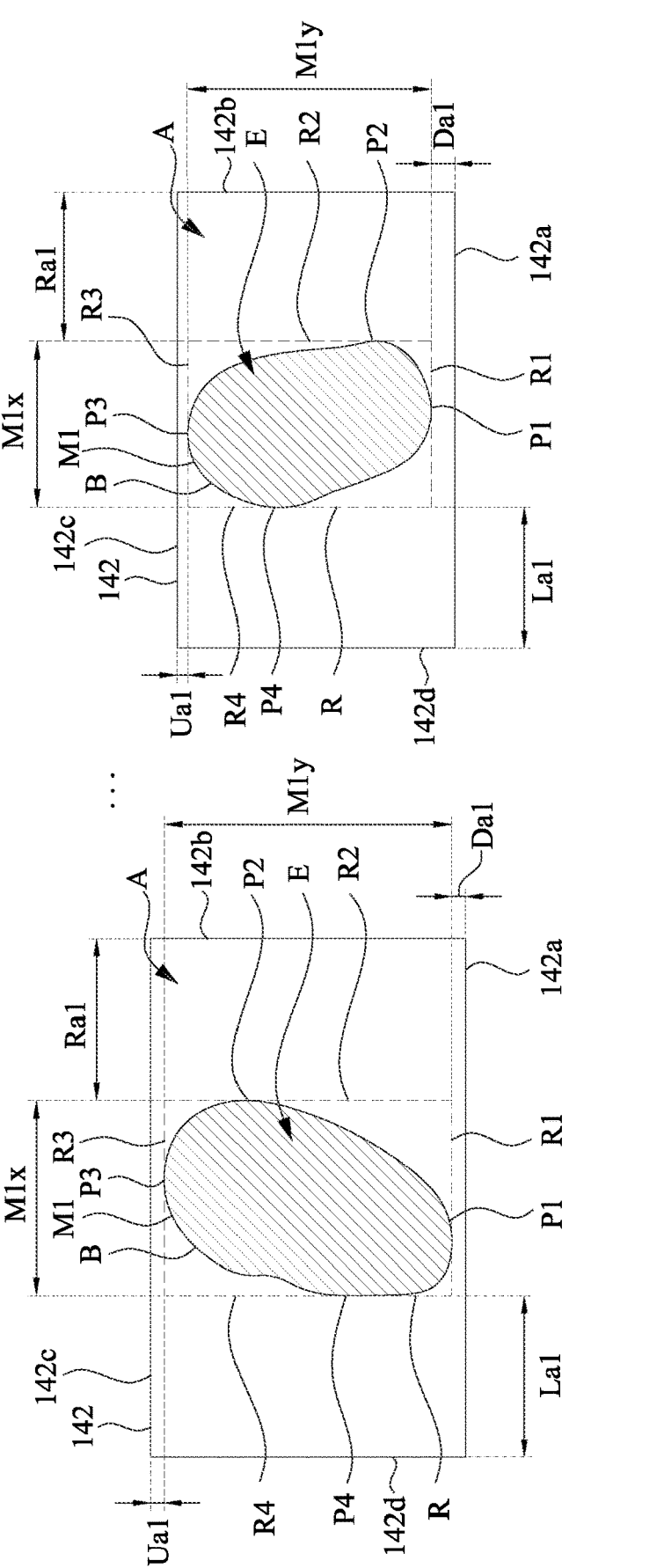

Similarly, as shown in FIG. 4O, when the ratio of the area E to the area A is above the second predetermined threshold percentage, it indicates a vertical deviation of the probes 283 relative to the probe pads 142. This suggests that the probes 283 are positioned lower than the desired level along the vertical direction. In such cases, it is possible for the ratios on all of the probe pads 142 to be above the second predetermined percentage, or for at least one ratio on at least one of the probe pads 142 to be above the second predetermined percentage while the other ratio falls within a range from the first predetermined threshold percentage to the second predetermined threshold percentage. Ensuring that the ratio of the probe mark area E to the probe pad area A falls within the predetermined threshold percentage range brings several benefits. It helps maintain consistent contact between the probe 283 and the probe pad 142 in each test. This leads to improved electrical performance and signal integrity, ensuring accurate measurement results. In addition, it reduces test variability by minimizing variations in the contact area, resulting in more reliable and reproducible test outcomes.

In some embodiments, the first predetermined threshold percentage can be defined in a range from 60% to 90%, such as about 60%, 65%, 70%, 75%, 80%, 85%, 90%, or 95%, meaning that if the ratio of the area E to the area A exceeds, for example about 90%. The second predetermined threshold percentage can be defined in a range from about 5% to 30%, such as about 5%, 10%, 15%, 20%, 25%, or 30%.

Figure 4P:
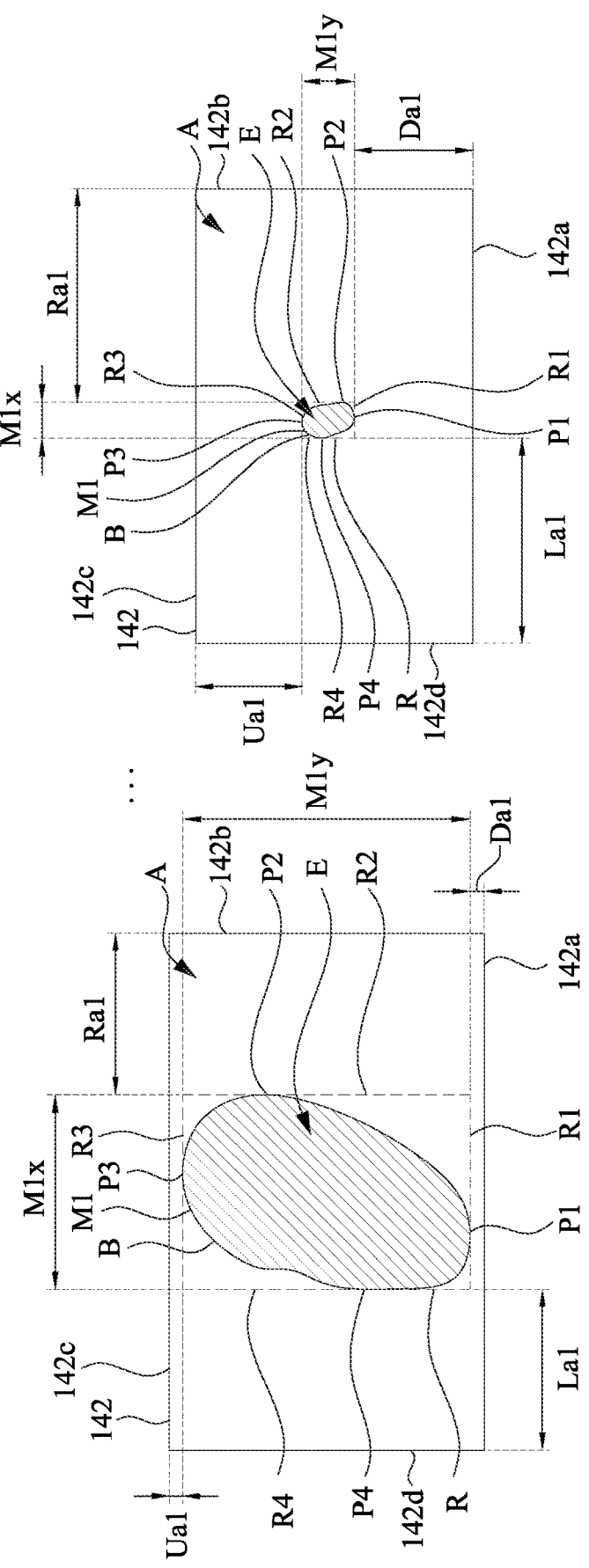

Furthermore, as shown in FIG. 4P, if a ratio of a greatest difference among corresponding two of the areas E to a greatest one of the areas E exceeds a third predetermined threshold percentage, it indicates a potential configuration issue with the probes 283 and/or the wafer stage 202. This comparison allows for the evaluation of the relative sizes of the areas E, providing insights into the consistency of probe mark coverage across different probe pads 283. This difference in the areas E indicates a vertical deviation in the configuration or alignment of the probes, potentially leading to inconsistent probe mark formation.

When such a configuration issue is detected, the IIM system 230 triggers a signal to notify the wafer acceptance test tool 200 about the need for further examination and verification of the probe configuration. This serves as an indication to investigate and rectify any potential misalignment, damage, or other issues related to the probes 283 and/or the wafer stage 202. In some embodiments, before proceeding with the previously mentioned content, the IIM system 230 may examine the behavior of the probe marks M1 on the other probe pads 142. If the areas of the probe marks M1 on the intermediate probe pads 142 exhibit a consistent decrease or increase in sequential order, it indicates a potential tilt in the probes 283 along the vertical direction (see FIG. 4B). This tilt can have consequences such as inconsistent probe mark formation and inaccurate testing results. Detecting this tilt allows us to identify the nature of the misalignment or deviation in the probe configuration. When such a configuration issue is detected, the IIM system 230 triggers a signal to the control unit 260 of the WAT system 228 to further adjust the probe configuration, addressing the tilt in the vertical direction. Specifically, the greatest difference among the corresponding two of the areas E can be determined by calculating the absolute value of the greatest difference among the corresponding two of the areas E through the IIM system 230. Subsequently, the greatest area among the areas E can be identified through the IIM system 230. Subsequently, a ratio can be determined by dividing the greatest difference among the areas E by the greatest one of the areas E through the IIM system 230. Subsequently, the IIM system 230 determines whether the calculated ratio exceeds the predetermined threshold percentage.

In some embodiments, the third predetermined threshold percentage can be greater than about 10%, such as about 10%, 20%, 30%, 40%, or 50%, implying that if the difference in the areas exceeds this value, it is considered a significant deviation. This percentile value can be adjusted based on specific requirements or standards to suit different testing scenarios.

Based on the sizes and positions of probe marks M1 on the probe pads 142, if the IIM system 230 determines that the sizes and positions of the probe marks M1 on the probe pads 142 are acceptable, the method proceeds to block S106. If the IIM system 230 detects a horizontal or vertical deviation of the probe relative to the probe pad 142, the method proceeds to block S1054. However, if the IIM system 230 identifies any abnormality in the sizes and positions of the probe marks M1 on the probe pads 142, it will notify the wafer acceptance test tool 200 about the abnormal configuration of probe 283. This notification indicates the need for a shutdown to perform an inspection.

Figure 6:
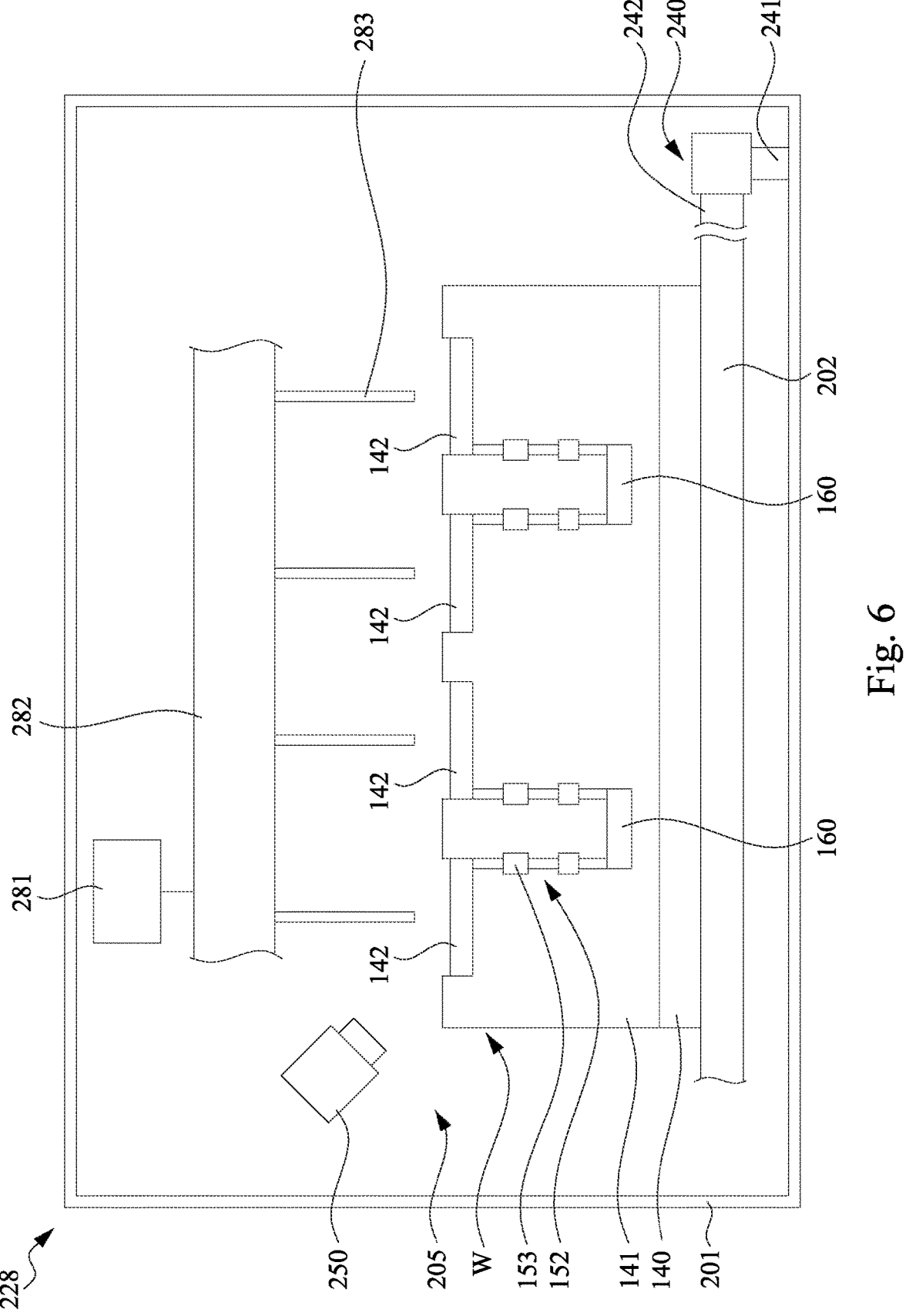
FIG. 6 illustrates a schematic view of a system for testing a semiconductor wafer by using a wafer acceptance test tool with an image inspection system in accordance with some embodiments of the present disclosure.

Returning to FIG. 1B, the wafer acceptance test method M then proceeds to block S1054 where the positions of the probes are automatically adjusted relative to the wafer stage 202 based on the analysis result from the IIM system. With reference to FIG. 6, in some embodiments of block S1054, to ensure precise alignment, adjustment parameters are defined based on the virtual boxes R. These adjustment parameters include the horizontal moving distances Rb, Lb, Ub, and Db (see FIG. 4A), which play a role in adjusting the horizontal position of the probes 283. Specifically, the horizontal moving distance Rb is calculated as half of the difference between the minimum distance Ra and the minimum distance La. Similarly, the horizontal moving distance Lb is determined as half of the difference between the minimum distance La and the minimum distance Ra. Likewise, the horizontal moving distance Ub is obtained as half of the difference between the minimum distance Ua and the minimum distance Da, while the horizontal moving distance Db is derived as half of the difference between the minimum distance Da and the minimum distance Ua. To compute these distances accurately, the minimum distance Ra is selected as the smallest value among the distance Ra1 on the all of the probe pads 142. Similarly, the minimum distance La represents the smallest value among the distance La on the all of the probe pads 142. The minimum distance Ua corresponds to the smallest value among the distance Ua on the all of the probe pads 142, while the minimum distance Da is determined as the smallest value among the distance Da on the all of the probe pads 142. It notes that the horizontal moving distances Rb and Lb are perpendicular to the horizontal moving distances Ub and Db. These calculated adjustment parameters allow for precise adjustments to the probe position relative to the wafer stage 202, ensuring that the probe mark M1 resulting from subsequent tests is closer to the center of the probe pad 142 and away from its edges.

When observing the probe marks M1 from a top view and applying the aforementioned formulas, if the marks M1 exhibit a leftward bias, it indicates that the probes 283 require a correction towards the right relative to the wafer stage 202, with a horizontal moving distance Rb (see FIG. 4A) determined by the calculated adjustment parameters. Conversely, if the marks M1 show a rightward bias, the probes 283 need to be corrected towards the left relative to the wafer stage 202, utilizing the horizontal moving distance Lb (see FIG. 4A) as determined by the formulas. Similarly, when examining the marks M1 from a top view and utilizing the provided formulas, if the marks M1 display a downward bias, it is determined that the probes 283 need to be corrected upward relative to the wafer stage 202, following the horizontal moving distance Ub (see FIG. 4A) as calculated. On the other hand, if the marks M1 appear upward, according to the aforementioned formulas, it indicates that the probes 283 should be corrected downward relative to the wafer stage 202, employing the horizontal moving distance Db (see FIG. 4A) as determined. These adjustments are made based on the relative positions of the probe marks M1 and the probe pads 142, ensuring that the probes 283 are precisely aligned to achieve the desired horizontal positioning and improve the accuracy of subsequent tests.

The deviation in the vertical direction can be detected by comparing the area E of the probe marks to the probe pad area A. By analyzing these ratios, we can determine if there is a vertical deviation of the probes 283 relative to the probe pads 142. Based on the calculated ratios, adjustment parameters such as vertical moving distances Hb and Tb (see FIG. 4A) can be defined to adjust the height of the probes 2883 in the vertical direction. These adjustment parameters enable precise control of the probe position to align it with the desired level on the probe pads 142. By adjusting the probe height, we can ensure optimal contacts between the probes 283 and the probe pads 142, leading to accurate and reliable testing results.

Specifically, to adjust the height of the wafer stage 202 in the vertical direction, we can utilize the ratios of the area E to the area A (i.e., probe mark area to probe pad area ratio) to calculate the vertical moving distance Hb or Tb (see FIG. 4A). An average of the percentages of areas E can be calculated to provide an overall measure of the vertical deviation. Subsequently, the calculated average percentage can be multiplied by a scaling factor to obtain the vertical moving distance Hb or the vertical moving distance Tb for the height of probes 283. The scaling factor can be determined based on the specific system requirements and characteristics. For example, in the case where the probes 283 are positioned below the desired level in the vertical direction, it is to adjust the probes 283 upward by the vertical moving distance Hb in the subsequent test. Conversely, if the probes 283 are positioned above the desired level in the vertical direction, they need to be adjusted downward by the vertical moving distance Tb in the next test. In some embodiments, the scaling factor can be an empirical data or a historical Data. By making these height adjustments based on the ratios of the probe mark areas to the probe pad areas, we can achieve more uniform contact areas between the probes 283 and the probe pads 142 in the vertical direction.

The tilt in the vertical direction of the probes 283 (see FIG. 4B) can be detected by comparing the greatest difference among the corresponding two of the areas E of the probe marks M1 to the largest one of the areas E. By analyzing the ratio among the areas E, we can determine if there is a tilt of the probes 283 relative to the probe pads 142. An adjustment parameter, such as adjustment angle G (see FIG. 4B), can be defined to adjust the angle of the wafer stage 202 in the vertical direction. The adjustment parameter can enable precise control of the probe position relative to the wafer stage 202 to align it with the desired angle to the probe pads 142. By adjusting the wafer stage angle, we can ensure optimal contacts between the probes 283 and the probe pads 142, leading to accurate and reliable testing results. Specifically, to adjust the angle of the probes 283 relative to the wafer stage 202, we can utilize the ratio among the areas E. The method for calculating the adjustment angle G may vary depending on the system and equipment being used. It may involve calibration algorithms or mathematical formulas designed to convert the ratio into an appropriate adjustment angle G. For example, the adjustment angle G can be calculated using trigonometric functions, such as arctan or arcsin.

The image processor 253 may generate the calculated adjustment parameters (i.e., the horizontal moving distance Rb, Ub, Db, Lb, the vertical moving distance Hb or Tb, and adjustment angle G) based on the identified probe marks M1 from the probe pad 142 of the captured image, and then transmitted the calculated adjustment parameters from the imaging system 230 to the control unit 260 of the wafer acceptance test tool 200. For example, the horizontal moving distances Rb, Ub, Db, and Lb guide the wafer stage 202's movement in the respective horizontal directions, the vertical moving distances Hb or Tb guide the wafer stage 202's movement in the vertical direction, and the adjustment angle G guides the wafer stage 202's rotation in a rotation directions. Subsequently, the control unit 260 of the wafer acceptance test tool 200 receives the calculated adjustment parameters, and then activates the positioning module 240 responsible for adjusting the position of the wafer stage 202 relative to the probes 283. The control unit 260 can control the positioning module 240 to execute the required movements. Thereafter, the controller 260 can control the driving element 245 to trigger or actuate the vertical movement and/or the horizontal movement of the first and second drive mechanism 241 and 242 and/or the rotation of the wafer stage 202 relative to the probes 283 in response to the calculated adjustment parameters, thus resulting in the vertical movement, the horizontal movement, and/or the rotation of the wafer stage 202, such that optimal contacts between the probe and the probe pad can be ensured. As the positioning module 240 adjusts the wafer stage's position, the image sensor 250 monitors the wafer stage 202's position and update the wafer stage position data to the computer 231 of the IIM system 230 to analysis and compared to the desired positions to ensure accurate alignment of the wafer stage 202 relative to the probes 283.

The adjustment of the probe's position relative to the wafer stage 202 in the horizontal, vertical, rotation directions can be achieved by obtaining the horizontal moving distance, the vertical moving distance, and the adjustment angle simultaneously. Alternatively, the adjustment can be done in a sequential manner. One option is to first determine the horizontal moving distance, and adjust the wafer stage's position in the horizontal direction and the adjustment angle accordingly. Once the horizontal adjustment is completed, the vertical moving distance and adjustment angle can be obtained, and the wafer stage's position can be further adjusted in the vertical direction and the rotation direction. Another option is to prioritize the vertical adjustment. In this case, the vertical moving distance is determined first, and the wafer stage's position is adjusted in the vertical direction and the adjustment angle accordingly. Once the vertical adjustment is completed, the horizontal moving distance and the adjustment angle can be obtained, and the wafer stage's position is adjusted in the horizontal direction and the rotation direction. Another option is to prioritize the angle adjustment. In this case, the vertical adjustment angle is determined first, and the wafer stage's position is adjusted in the horizontal and vertical directions accordingly. Once the angle adjustment is completed, the horizontal and vertical moving distances can be obtained, and the wafer stage's position is adjusted in the and vertical moving distances.

Figure 7A:
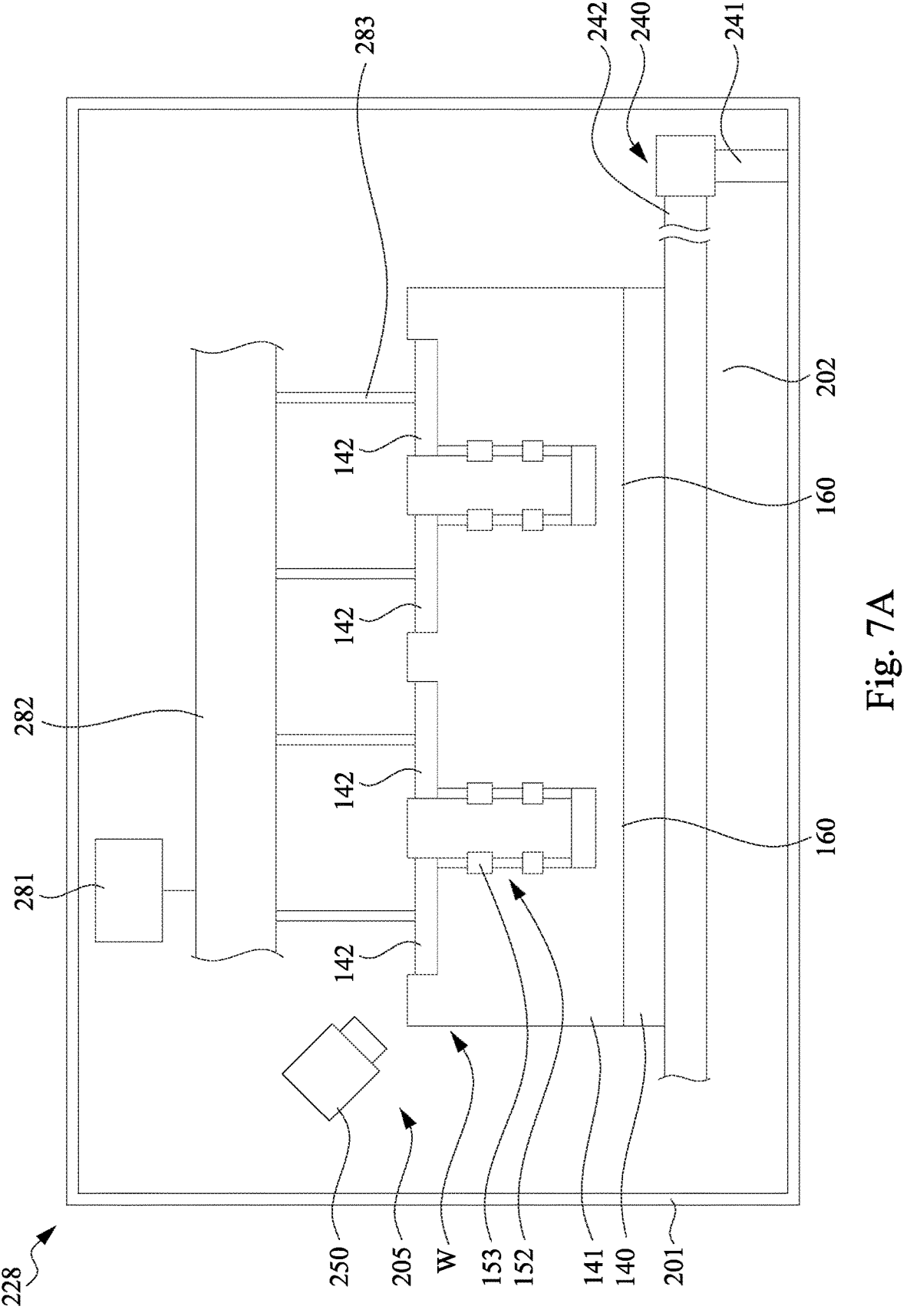
FIG. 7A illustrates a schematic view of a wafer acceptance test for a semiconductor wafer in accordance with some embodiments of the present disclosure.
Figure 7B:
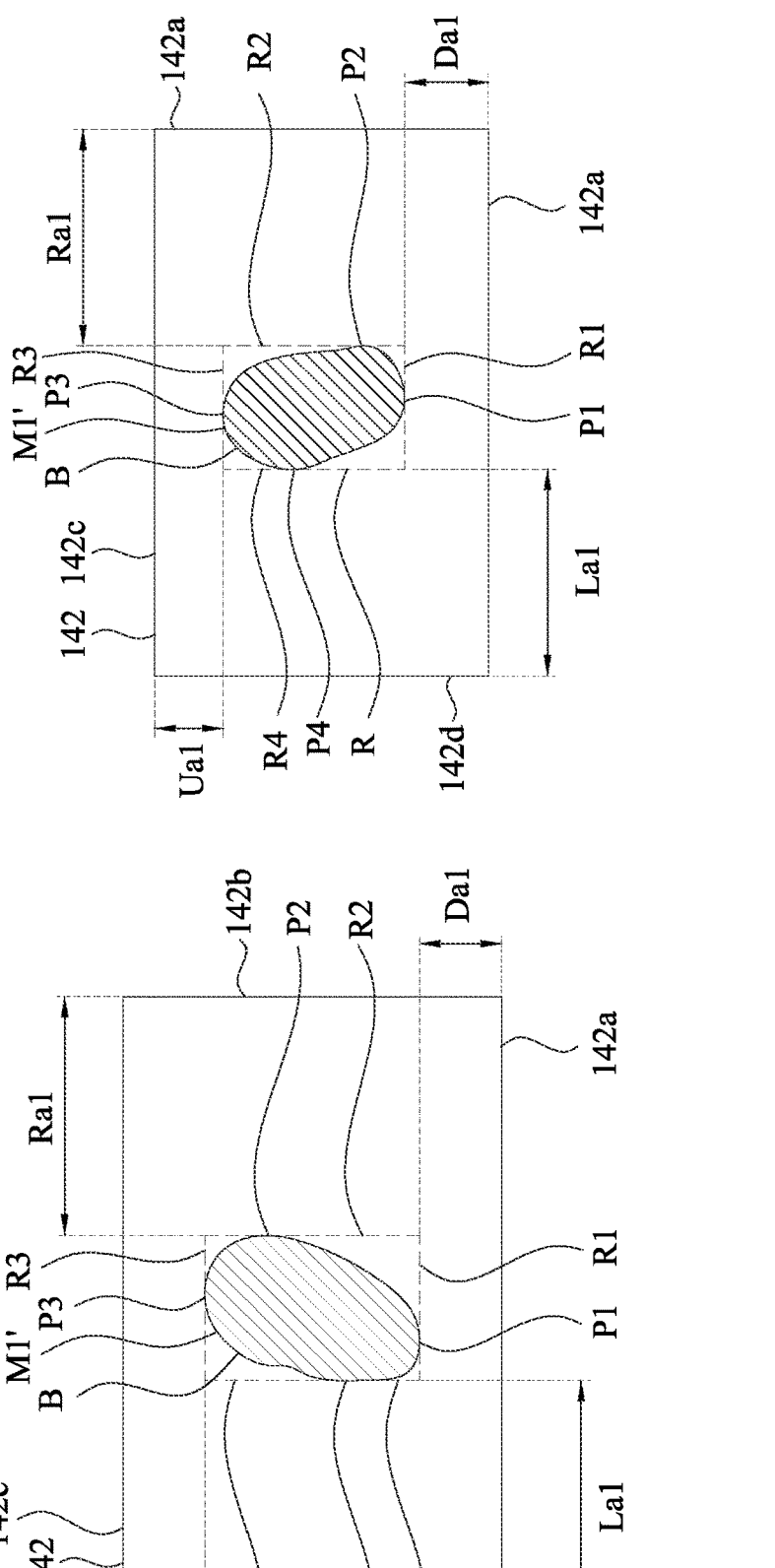
FIGS. 7B and 7C illustrate schematic views of probe pads having probe marks thereon after wafer acceptance tests in accordance with some embodiments of the present disclosure.
Figure 7C:
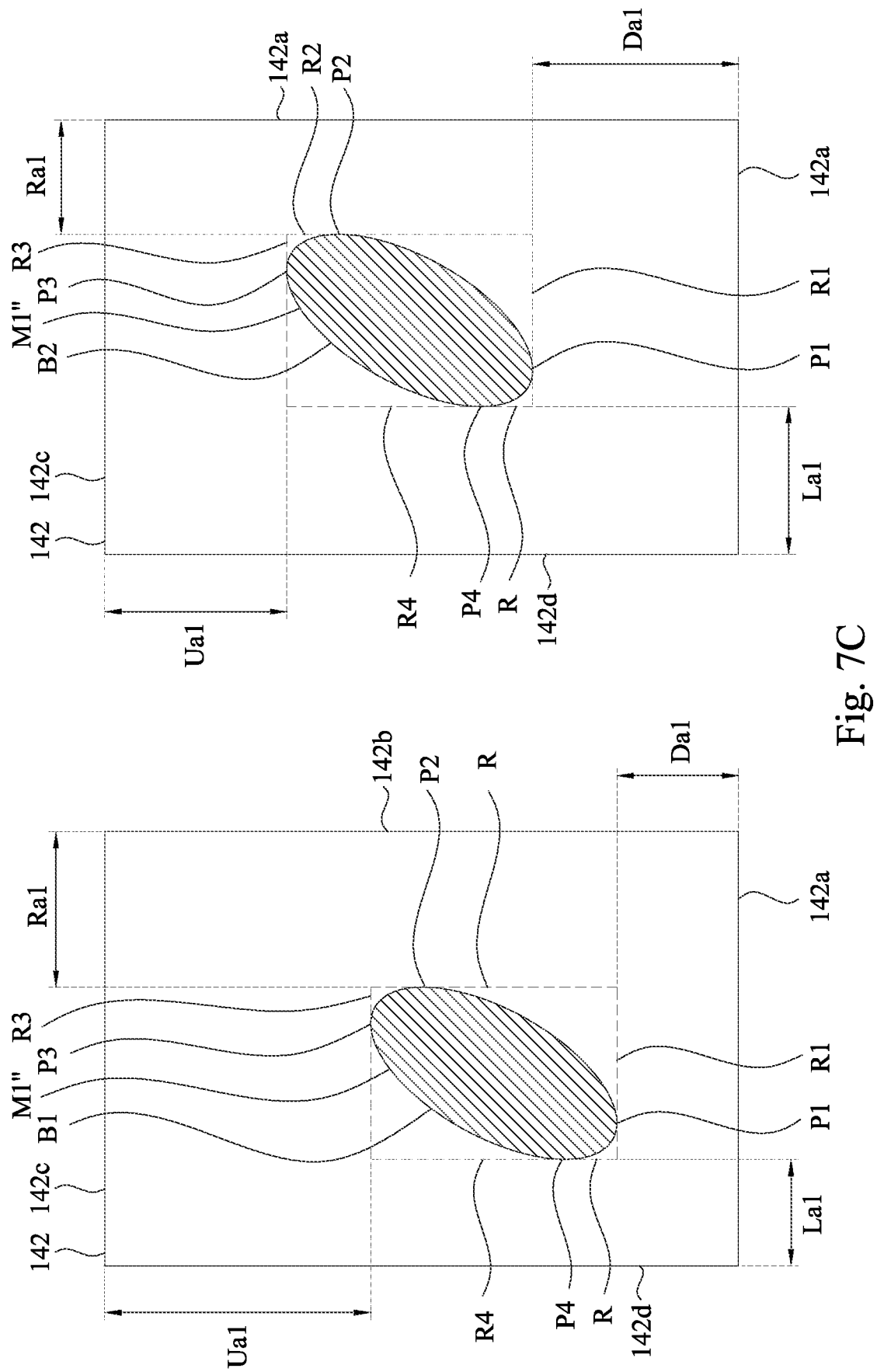

Returning to FIG. 1B, the wafer acceptance test method M then proceeds to block S1055 where the probes are pressed against the probe pads at the adjusted positions (i.e. a modified pressed against position different than the first pressed against positon as shown in FIG. 4A) to obtain adjusted probe marks on the probe pads. With reference to FIGS. 7A and 7B, in some embodiments of block S1055, the probes 283 are pressed against the probe pads 142 to create new probe marks M1' on the surface of the probe pads 142. This step ensures that the probes 283 (see FIG. 7A) are in proper contact with the pads 142 for accurate testing. The pressing action ensures a reliable electrical connection between the probes 283 and the probe pads 142, allowing for the measurement of the wafer's characteristics. After the probe marks M1' are created, the process returns to block S1052, where the imaging system 220 captures images of the probe marks M1' (see FIG. 7B). These images are then uploaded to the IIM system 230 (see FIG. 4C) for further analysis. In block S1053, the system evaluates the captured images and determines whether the probe positions need further adjustment or if they are satisfactory for the subsequent wafer acceptance test (WAT). This evaluation is based on the quality and alignment of the new probe marks M1' on the probe pads 142. FIG. 7C illustrates another example of readjusting the position of the probe, resulting in the generation of a new probe mark M1" on the probe pad 142.

The wafer acceptance test method M can utilize techniques such as AI-based image analysis and boundary localization to precisely align and position the probes 283 relative to the wafer W and probe pads 142. This ensures accurate and reliable testing results. In addition, the wafer acceptance test method M can minimize the occurrence of test problems and issues by ensuring proper probe positioning and contact with the probe pads 142. This results in higher test quality and fewer errors or failures. Furthermore, the method incorporates feedback mechanisms and data logging, allowing for continuous analysis of probe marks, adjustments, and test results. This data can be used to identify patterns, optimize processes, and further enhance the overall testing workflow. Moreover, by automating various processes, such as probe alignment and adjustment, the method can reduce the time required for calibration and testing. This leads to improved operational efficiency and increased productivity.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a WAT tool that enables automated recognition and adjustment of probe marks. By integrating an advanced AI-powered image inspection machine (IIM), the WAT tool addresses the limitations of human visual recognition by accurately analyzing probe mark images captured by cameras. Through extensive machine learning on a diverse range of probe mark samples, the IIM achieves identification of various characteristics, such as pad texture, shading, density, and position. By utilizing the data from the IIM, the WAT tool can determine the required adjustments for probe marks, eliminating the need for manual intervention and enhancing process efficiency. This leads to a t reduction in process time, improved productivity, and enhanced quality assurance. Furthermore, the tool accurately records and logs all probe mark adjustments, enabling valuable analysis and optimization of the process.

In some embodiments, a method includes pressing probes against probe pads on a test line over a substrate at a first position on the probe pads to form first probe marks on the probe pads; capturing first images of the first probe marks on the probe pads; transmitting the captured first images of the first probe marks to an image inspection machine; identifying the first probe marks from the probe pads of the captured first images through the image inspection machine; determining whether the identified first probe marks are acceptable through the image inspection machine; in response to the determination determines that the identified first probe marks are acceptable, performing a first wafer acceptance test (WAT) to the substrate with the probes at the first position. In some embodiments, the method further includes in response to the determination determines that the identified first probe marks are not acceptable, generating an adjustment parameter through the image inspection machine to adjust the first position of the probes on the probe pads. In some embodiments, the method further includes transmitting the adjustment parameter to a control unit; actuating a movement of the substrate relative to the probes based on the adjustment parameter through the control unit. In some embodiments, the method further includes pressing probes against the probe pads at a second position on the probe pads in response to the adjustment parameter to form second probe marks on the probe pads. In some embodiments, the method further includes capturing second images of the second probe marks on the probe pads; identifying the second probe marks from the probe pads of the captured second images through the image inspection machine; determining whether the identified second probe marks are acceptable through the image inspection machine. In some embodiments, the method further includes in response to the determination determines that the identified second probe marks are acceptable, performing a second WAT to the substrate with the probes at the second position different than the first position. In some embodiments, the method further includes recording the captured first images of the first probe marks in the image inspection machine. In some embodiments, identifying the first probe marks from the probe pads of the captured first images is performed by using an artificial intelligence-based image analysis, based on reference images stored in the image inspection machine. In some embodiments, determining whether the identified first probe marks are acceptable includes: identifying a position of one of the first probe marks on a corresponding one of the probe pads from the captured first images through the image inspection machine. In some embodiments, determining whether the identified first probe marks are acceptable includes: identifying a size of one of the first probe marks on a corresponding one of the probe pads from the captured first images through the image inspection machine.

In some embodiments, a method includes pressing probes against probe pads arranged in a line over a wafer to form probe marks on the probe pads; capturing images including the probe marks on the probe pads; recording the captured images in an image inspection machine; identifying the probe marks from the probe pads of the captured images using an artificial intelligence-based image analysis through the image inspection machine; generating an adjustment parameter based on the identified probe marks through the image inspection machine; pressing the probes against the probe pads in response to the adjustment parameter; performing a wafer acceptance test to the wafer. In some embodiments, generating the adjustment parameter based on the identified probe marks includes: generating virtual boxes encompassing the identified probe marks of the captured images through the image inspection machine to calculate the adjustment parameter. In some embodiments, generating the adjustment parameter based on the identified probe marks includes: calculating first and second distances from opposite two sides of a first one of the virtual boxes to opposite two sides of a first one of the identified probe marks from the captured images; calculating third and fourth distances from opposite two sides of a second one of the virtual boxes to opposite two sides of a second one of the identified probe marks from the captured images through the image inspection machine; selecting a smaller one of the first and second distances through the image inspection machine; selecting a smaller one of the third and fourth distances through the image inspection machine; obtaining the adjustment parameter as half of a difference between the smaller one of the first and second distances and the smaller one of the third and fourth distances through the image inspection machine. In some embodiments, pressing the probes against the probe pads is performed at a modified position on the probe pads in response to the adjustment parameter related to a horizontal direction. In some embodiments, generating the adjustment parameter based on the identified probe marks includes: calculating an area defined by the first virtual box through the image inspection machine; obtaining the adjustment parameter in response to the calculated area through the image inspection machine. In some embodiments, pressing the probes against the probe pads is performed at a modified position on the probe pads in response to the adjustment parameter related to a vertical direction. In some embodiments, before performing the wafer acceptance test, determining whether the step of pressing the probes against the probe pads in response to the adjustment parameter is acceptable through the image inspection machine.

In some embodiments, a system includes a wafer stage, probes, a controller, a wafer stage, a positioning module, a testing apparatus, an image inspection apparatus, and a control unit. The wafer stage is in the wafer acceptance test chamber. The probes are in the wafer acceptance test chamber. The controller initiates a relative motion between the wafer stage and the probes, the relative motion allowing the probes to press against probe pads on a wafer held on the wafer stage to form probe marks on the probe pads. The image inspection apparatus includes an image sensor and an image processor. The image sensor is disposed in the wafer acceptance test chamber, in which the image sensor is configured to capture an image of probe mark marks. The image processor is electrically connected to the image sensor, in which the image processor is configured to generate an adjustment parameter based on the captured image. The positioning module is connected to the wafer stage. The positioning module is configured to adjust a position of the wafer stage in response to the adjustment parameter. In some embodiments, the relative motion initiated by the controller is moving the wafer stage while keeping the probes stationary. In some embodiments, the relative motion initiated by the controller includes moving the wafer stage vertically and horizontally.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
pressing probes against probe pads on a test line over a substrate at a first position on the probe pads to form first probe marks on the probe pads;
capturing first images of the first probe marks on the probe pads;
transmitting the captured first images of the first probe marks to an image inspection machine;
identifying the first probe marks from the probe pads of the captured first images through the image inspection machine;
determining whether the identified first probe marks are acceptable through the image inspection machine, the determining comprising detecting whether an area of one of the first probe marks on a corresponding one of the probe pads from the captured first images is smaller than a predetermined threshold area, and when the area of the first probe marks is smaller than the predetermined threshold area, determining the one of the first probe marks as not acceptable; and
in response to the determination determines that the identified first probe marks are acceptable, performing a first wafer acceptance test (WAT) to the substrate with the probes at the first position.

2. The method of claim 1, further comprising:
in response to the determination determines that the identified first probe marks are not acceptable, generating an adjustment parameter through the image inspection machine to adjust the first position of the probes on the probe pads.

3. The method of claim 2, further comprising:
transmitting the adjustment parameter to a control unit; and
actuating a movement of the substrate relative to the probes based on the adjustment parameter through the control unit.

4. The method of claim 2, further comprising:
pressing probes against the probe pads at a second position on the probe pads in response to the adjustment parameter to form second probe marks on the probe pads.

5. The method of claim 4, further comprising:
capturing second images of the second probe marks on the probe pads;
identifying the second probe marks from the probe pads of the captured second images through the image inspection machine; and
determining whether the identified second probe marks are acceptable through the image inspection machine.

6. The method of claim 5, further comprising:
in response to the determination determines that the identified second probe marks are acceptable, performing a second WAT to the substrate with the probes at the second position different than the first position.

7. The method of claim 1, further comprising:
recording the captured first images of the first probe marks in the image inspection machine.

8. The method of claim 1, wherein identifying the first probe marks from the probe pads of the captured first images is performed by using an artificial intelligence-based image analysis, based on reference images stored in the image inspection machine.

9. The method of claim 1, wherein determining whether the identified first probe marks are acceptable comprises:
identifying a position of one of the first probe marks on a corresponding one of the probe pads from the captured first images through the image inspection machine.

10. The method of claim 1, further comprising:
comparing areas of the first probe marks across the probe pads through the image inspection machine to determine a tilt condition of the probes.

11. The method of claim 10, further comprising:
in response to detecting a tilt exceeding a predetermined threshold angle, generating, through the image inspection machine, an adjustment parameter comprising an adjustment angle; and
applying the adjustment angle to correct the tilt of the probes relative to a wafer stage.

12. A method, comprising:
pressing probes against probe pads arranged in a line over a wafer to form probe marks on the probe pads;
capturing images including the probe marks on the probe pads;
recording the captured images in an image inspection machine;
identifying the probe marks from the probe pads of the captured images using an artificial intelligence-based image analysis through the image inspection machine;
generating an adjustment parameter based on the identified probe marks through the image inspection machine, wherein the step of generating the adjustment parameter comprises:
generating, by the image inspection machine, virtual boxes respectively surrounding the identified probe marks of the captured images, each of the virtual boxes having four sides in contact with respective edges of a corresponding one of the probe marks, and determining distances between the sides of the virtual boxes and corresponding edges of the probe pads to calculate the adjustment parameter;
pressing the probes against the probe pads in response to the adjustment parameter; and
performing a wafer acceptance test to the wafer.

13. The method of claim 12, wherein generating the adjustment parameter based on the identified probe marks comprises:

calculating first and second distances from opposite two sides of a first one of the virtual boxes to opposite two sides of a first one of the identified probe marks from the captured images;

calculating third and fourth distances from opposite two sides of a second one of the virtual boxes to opposite two sides of a second one of the identified probe marks from the captured images through the image inspection machine;

selecting a smaller one of the first and second distances through the image inspection machine;

selecting a smaller one of the third and fourth distances through the image inspection machine; and obtaining the adjustment parameter as half of a difference between the smaller one of the first and second distances and the smaller one of the third and fourth distances through the image inspection machine.

14. The method of claim 13, wherein pressing the probes against the probe pads is performed at a modified position on the probe pads in response to the adjustment parameter related to a horizontal direction.

15. The method of claim 12, wherein generating the adjustment parameter based on the identified probe marks comprises:

calculating an area defined by a first one of the virtual boxes through the image inspection machine; and obtaining the adjustment parameter in response to the calculated area through the image inspection machine.

16. The method of claim 15, wherein pressing the probes against the probe pads is performed at a modified position on the probe pads in response to the adjustment parameter related to a vertical direction.

17. The method of claim 15, further comprising:

before performing the wafer acceptance test, determining whether the step of pressing the probes against the probe pads in response to the adjustment parameter is acceptable through the image inspection machine.

18. A system, comprising:

a wafer stage in a wafer acceptance test chamber;

probes in the wafer acceptance test chamber;

a controller initiating a relative motion between the wafer stage and the probes, the relative motion allowing the probes to press against probe pads on a wafer held on the wafer stage to form probe marks on the probe pads;

an image inspection apparatus comprising:

an image sensor disposed in the wafer acceptance test chamber, wherein the image sensor is configured to capture an image of the probe marks; and an image processor electrically connected to the image sensor, wherein the image processor is configured to compare areas of the probe marks across multiple probe pads to determine a tilt condition of the probes, and in response to detecting a tilt exceeding a predetermined threshold, to generate an adjustment parameter comprising an adjustment angle for correcting the tilt of the probes relative to the wafer stage; and a positioning module connected to the wafer stage, wherein the positioning module is configured to adjust a position and an angular orientation of the wafer stage in response to the adjustment parameter.

19. The system of claim 18, wherein the relative motion initiated by the controller is moving the wafer stage while keeping the probes stationary.

20. The system of claim 18, wherein the relative motion initiated by the controller includes moving the wafer stage vertically and horizontally.

\* \* \* \* \*